(12) United States Patent
Cho et al.

(10) Patent No.: US 9,379,117 B2
(45) Date of Patent: Jun. 28, 2016

(54) SEMICONDUCTOR DEVICE WITH BURIED BIT LINE AND METHOD FOR FABRICATING THE SAME

(71) Applicant: SK hynix Inc., Gyeonggi-do (KR)

(72) Inventors: Heung-Jae Cho, Gyeonggi-do (KR); Eui-Seong Hwang, Gyeonggi-do (KR); Eun-Shil Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/962,933

(22) Filed: Dec. 8, 2015

(65) Prior Publication Data

US 2016/0086957 A1 Mar. 24, 2016

Related U.S. Application Data

(62) Division of application No. 14/565,222, filed on Dec. 9, 2014, now Pat. No. 9,236,386, which is a division of application No. 13/720,109, filed on Dec. 19, 2012, now Pat. No. 8,936,982.

(30) Foreign Application Priority Data

Aug. 28, 2012 (KR) .................. 10-2012-0094460

(51) Int. Cl.
*H01L 21/336* (2006.01)
*H01L 27/108* (2006.01)
*H01L 21/8239* (2006.01)
*H01L 29/45* (2006.01)
*H01L 29/417* (2006.01)
*H01L 29/66* (2006.01)
*H01L 29/78* (2006.01)

(52) U.S. Cl.
CPC .... *H01L 27/10885* (2013.01); *H01L 27/10876* (2013.01); *H01L 21/8239* (2013.01); *H01L 29/41741* (2013.01); *H01L 29/456* (2013.01); *H01L 29/66666* (2013.01); *H01L 29/7827* (2013.01)

(58) Field of Classification Search
CPC .............. H01L 27/629; H01L 21/8239; H01L 27/10885; H01L 29/41741; H01L 29/66666; H01L 29/7827; H01L 29/456; H01L 29/78
USPC .................. 438/253, 268, 510.262, 270, 212; 257/296, 306, 331, 776, 329
See application file for complete search history.

(56) References Cited

U.S. PATENT DOCUMENTS

2006/0043617 A1* 3/2006 Abbott ............. H01L 27/10885
257/427

* cited by examiner

*Primary Examiner* — Thinh T Nguyen
(74) *Attorney, Agent, or Firm* — IP & T Group LLP

(57) ABSTRACT

A method for fabricating a semiconductor device includes etching semiconductor substrate to form bulb-type trenches that define a plurality of active regions in the semiconductor substrate; forming a supporter in each of the bulb-type trenches; dividing each active region, of the plurality of active regions, into a pair of body lines by forming a trench through each active region; and forming a bit line in each body line of the pair of body lines.

7 Claims, 21 Drawing Sheets

SEMICONDUCTOR DEVICE WITH BURIED BIT LINE AND METHOD FOR FABRICATING THE SAME

CROSS REFERENCE TO RELATED APPLICATIONS

This application is a division of U.S. patent application Ser. No. 14/565,222 filed on Dec. 9, 2014, which is a division of U.S. patent application Ser. No. 13/720,109 filed on Dec. 19, 2012, now U.S. Pat. No. 8,936,982 issued on Jan. 20, 2015, which claims priority of Korean Patent Application No. 10-2012-0094460, filed on Aug. 28, 2012. The disclosure of each of the foregoing application is incorporated herein by reference in its entirety.

BACKGROUND

1. Field

Exemplary embodiments of the present invention relate to a semiconductor device, and more particularly, to a semiconductor device with a buried bit line and a method for fabricating the same.

2. Description of the Related Art

Most semiconductor devices include transistors. For example, in a memory device such as a DRAM, a memory cell includes a cell transistor such as a MOSFET. In general, in the MOSFET, source/drain regions are formed in a semiconductor substrate, so that a planar channel is formed between the source region and the drain region. Such a general MOSFET is called a 'planar channel transistor'.

Since it is necessary to continuously improve the degree of integration and performance of a memory device, a fabrication technology of the MOSFET has reached a physical limit. For example, as the size of a memory cell is reduced, the size of the MOSFET is reduced, so that the channel length of the MOSFET is also reduced. When the channel length of the MOSFET is reduced, the characteristics of the memory device are degraded due to various problems such as degradation of data retention characteristics.

In order to increase the channel length, a vertical channel transistor (VCT) has been proposed. The vertical channel transistor includes a pillar in which a vertical channel is formed. A source region and a drain region are formed at the upper portion and the lower portion of the pillar. One of the source region and the drain region is connected to a bit line.

FIG. 1 is a diagram illustrating a semiconductor device in the conventional art.

Referring to FIG. 1, a plurality of bodies 12, which are separated from each other, are formed in a semiconductor substrate 11. A pillar 13 is formed vertical to the surface of the bodies 12. A buried bit line 14 is buried in the body 12. The pillar 13 includes first and second source/drain regions 16 and 18 and a channel region 17. A word line 15 extending in a direction crossing the buried bit line 14 is formed at the sidewall of the pillar 13. Since the word line 15 has a vertical structure, a vertical channel is formed. The first source/drain region 16 may also be formed in the body 12.

In the conventional art of FIG. 1, the semiconductor substrate 11 is etched by considering the height of the pillar 13 including the channel region 17, so that a preliminary body line is formed. Then, the upper portion of the preliminary body line is etched to form the pillar 13. The lower portion of the pillar 13 becomes the body 12.

In the conventional art, in order to substantially prevent punch-through (refer to a reference numeral 'P') between adjacent buried bit lines 14, it is necessary to ensure a predetermined height (refer to a reference numeral 'P1') at the lower portion of the buried bit line 14. The height P1 for substantially preventing the punch-through is about 80 nm to about 90 nm inclusive of the depth of the first source/drain region 16 formed below the buried bit line 14. Therefore, since the total height (a reference numeral 'H') of the body 12 and the pillar 13 is very high, a high aspect ratio etching process is required when forming the preliminary body line.

As a consequence, in the conventional art, since it is necessary to consider the height of the body 12 and the pillar 13, the high aspect ratio etching process is required. Moreover, since an aspect ratio is further increased in order to substantially prevent the punch between the adjacent buried bit lines 14, pattern leaning occurs.

In addition, in the conventional art, an interval between the adjacent buried bit lines 14 is increased, but there is a limitation in reducing parasitic capacitance between the adjacent buried bit lines 14. That is, the area of the first source/drain region 16 connected to the buried bit lines 14 has an influence on the parasitic capacitance. Therefore, a facing area (a reference numeral 'P2') between the adjacent buried bit lines 14 includes the first source/drain region 16, resulting in an increase in the parasitic capacitance.

SUMMARY

An embodiment of the present invention is directed to a semiconductor device capable of substantially preventing pattern leaning due to a high aspect ratio etching process and a method for fabricating the same.

An embodiment of the present invention is directed to a semiconductor device capable of substantially preventing a punch-through between adjacent buried bit lines and reducing parasitic capacitance and a method for fabricating the same.

In accordance with an exemplary embodiment, a method for fabricating a semiconductor device includes: etching a semiconductor substrate to form bulb-type trenches that define a plurality of active regions in the semiconductor substrate; forming a supporter in each of the bulb-type trenches; dividing each active region, of the plurality of active regions, into a pair of body lines by forming a trench through each active region; and forming a bit line in each body line of the pair of body lines.

In accordance with an exemplary embodiment, a method for fabricating a semiconductor device includes: forming an insulation layer on a semiconductor substrate; forming a conductive layer on the insulation layer; etching the conductive layer to form first trenches that define a plurality of active regions; forming a supporter in each of the trenches; dividing each active region, of the plurality of active regions into a pair of body lines by forming a second trench through each active region; and forming a bit line in each body line of the pair of body.

In an exemplary embodiment, a semiconductor device includes: a semiconductor substrate, an active region, including a body, formed on a surface of the semiconductor substrate; a pillar formed on the body; a supporter buried the active region; and a buried bit line formed in the body.

According to the present invention, after the supporter is formed, the body lines are formed by bisecting the active region, so that it is possible to substantially prevent the body lines from being leaned.

According to the present invention, an insulation material is formed below the buried bit lines so that it is possible to substantially prevent punch between adjacent buried bit lines.

According to the present invention, facing areas between buried bit lines are reduced, so that it is possible to reduce parasitic capacitance between the buried bit lines.

DETAILED DESCRIPTION

Figure 1:
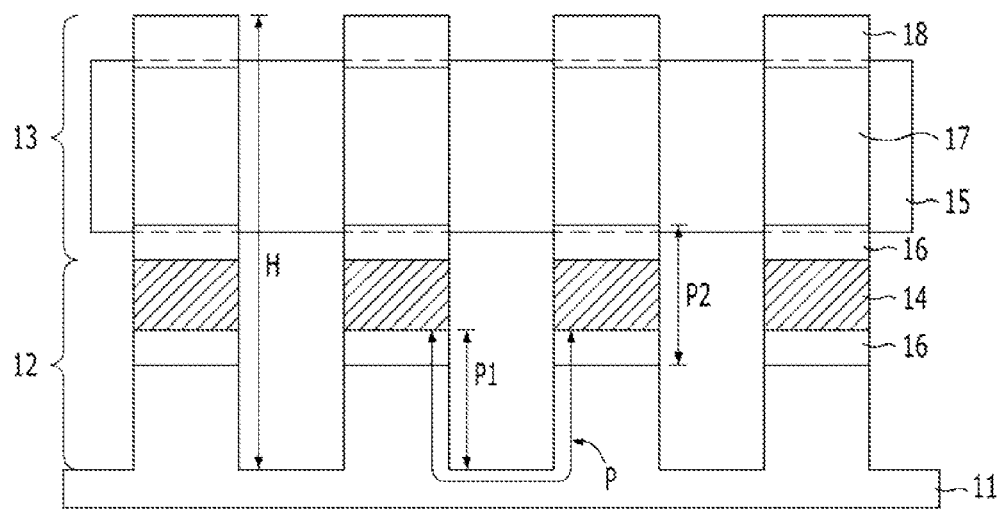
FIG. 1 is a diagram illustrating a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
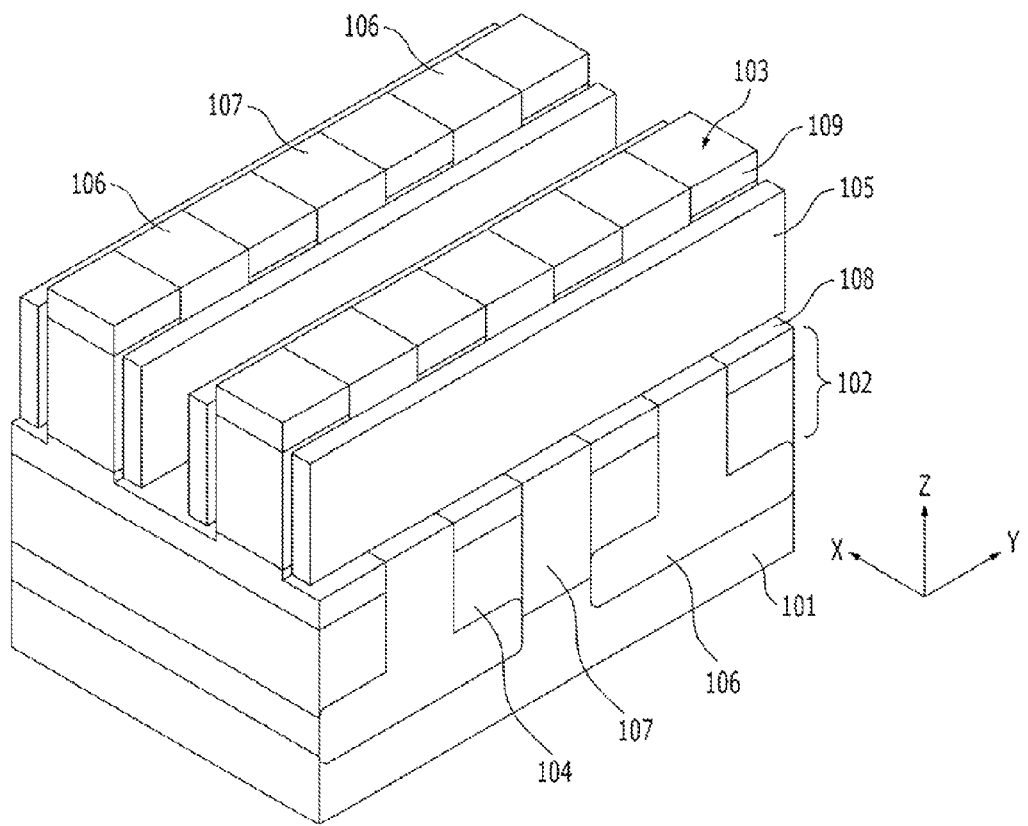
FIG. 2A is a diagram illustrating a semiconductor device with a buried bit line in accordance with an exemplary embodiment.
Figure 2B:
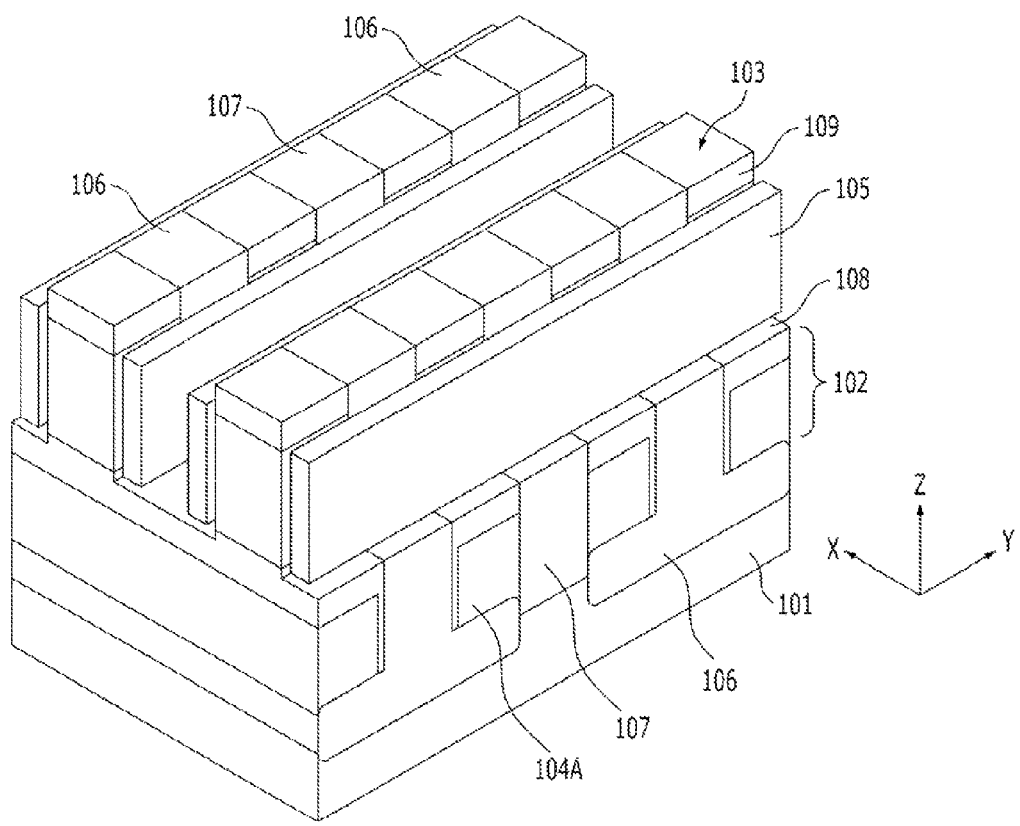
FIG. 2B is a diagram illustrating a semiconductor device with a buried bit line in accordance with an exemplary embodiment.

FIG. 2A is a diagram illustrating a semiconductor device with a buried bit line in accordance with an exemplary embodiment. FIG. 2B is a diagram illustrating a semiconductor device with a buried bit line in accordance with an exemplary embodiment. FIG. 2 is a diagram illustrating an exemplary semiconductor device with a buried hit line.

Referring to FIG. 2A, a semiconductor device includes buried bit lines 104, pillars 103, and word lines 105. A plurality of active regions, each including a body 102 and a pillar 103, are formed substantially perpendicular to a surface of a semiconductor substrate 101. Supporters 106 are buried among the plurality of active regions, respectively. The buried bit lines 104 are buried in the bodies 102, respectively.

The semiconductor substrate 101 may include a silicon-containing material, such as a single crystalline silicon. The bodies 102, the pillars 103, and the semiconductor substrate 101 may include substantially the same material. Thus, the bodies 102 and the pillars 103 may include a silicon-containing material, such as single crystalline silicon.

An active region has a linear structure and includes a body 102 and a pillar 103 formed on the body 102. Multiple pillars 103 may be formed on a common body 102. Each body 102 may have a linear structure formed on the semiconductor substrate 101. The body 102 and the pillars 103 are formed substantially perpendicular to the surface of the semiconductor substrate 101. For example, the body 102 and the pillars 103 may be perpendicular to each other. The pillars 103 are separated from one another on the body 102. For example, the pillars 103 may have a matrix array arrangement. Each pillar 103 may include a channel region of a vertical channel transistor. Furthermore, each pillar 103 may include a first source/drain region 108, a second source/drain region 109, and a channel region of the vertical channel transistor. The first source/drain region 108 may be connected to corresponding buried bit line 104, between the first source/drain region 108 and the second source/drain region 109. The second source/drain region 109 may be connected to a capacitor. The first source/drain region 108, the channel region, and the second source/drain region 109 may be connected to one another in a direction substantially perpendicular to the surface of the substrate 101.

The first source/drain region 108, the channel region, and the second source/drain region 109 may form a NPN junction or a PNP junction. For example, when the first source/drain region 108 or second source/drain region 109 is doped with a first conductive impurity, the channel region may be doped with a second conductive impurity having an opposite type to the first conductive impurity. For example, if the first conductive impurity is an N-type impurity, then the second conductive impurity will be P-type impurities. Alternatively, if the first conductive impurity is a P-type impurity, then the second conductive impurity will be N-type impurities. When the vertical channel transistor is an NMOSFET, the first source/drain region 108, the second source/drain region 109, and the channel region may form a NPN junction.

The bodies 102 are formed in a third direction (a Z direction) perpendicular to a surface of the semiconductor substrate 101. The bodies 102 may have a linear structure extending in a first direction (an X direction). The buried bit lines 104 and the bodies 102 may extend in the first direction. As will be described later, the bodies 102 may be formed by bisecting the linear active region.

Supporter 106 is buried between the bodies 102 in a bulb-type trench that separates adjacent bodies 102. A part of a supporter 106 buried in the bulb-type trench may extend to a lower portion of a body 102. When the supporter 106 includes an insulation material, the body 102 has a structure formed on a silicon on insulator (SOI) structure. The supporter 106 may extend parallel to the body 102. Furthermore, the supporter 106 may extend perpendicular to the surface of the substrate (the Z direction), so that the supporter 106 is formed between adjacent pillars 103. The active region, including the body 102 and the pillar 103 may be separated by the supporter 106. An insulation layer 107 may be formed between adjacent active regions. The insulation layer 107 may also be formed parallel to the body 102, and may perpendicular to the surface of the substrate (the Z direction), so that the insulation layer 107 is formed between the pillars 103. Accordingly, when viewed from the X direction (as shown in FIG. 2A), the pillar 103, the supporter 106, and the insulation layer 107 may be alternately formed.

A buried bit line 104 is buried in the body 102. In order to bury the buried bit line 104 in the body 102, a fully silicided process may be used. The buried bit line 104 may extend in the first direction (the X direction). The buried bit line 104 may include a metallic material, such as a metal silicide. Thus, the buried bit line 104 has a low resistance. A part of the supporter 106 may be formed below the buried bit line 104. The insulation layer 107 may be formed between adjacent buried bit lines 104. As illustrated in FIG. 2B, an exemplary semiconductor device may have a structure in which a buried bit line 104A is buried in a recessed lower sidewall of the body 102. The buried bit line 104A may include a metal layer or a metal silicide.

A word line 105 is formed at a sidewall of the pillar 103, wherein the word line 105 is formed vertical to the sidewall of the pillar 103. Accordingly, the word line 105 is also called a vertical word line. Word lines 105 are formed at both sidewalls of the pillar 103 and may have a double word line structure. Even in the double word line structure, ends of respective word lines 105 may be connected to each other. Since the pillar 103 is a region in which the channel of the vertical channel transistor is formed, a vertical channel is formed by the word line 105. Consequently, the vertical channel transistor, including the word line 105, the first source/drain region 108, the channel region, and the second source/drain region 109, is formed. The word fines 105 may extend in the second direction (the Y direction). The word lines 105 and the buried bit lines 104 may be formed in a direction in which they cross each other. The word lines 105 may include a metallic material. The word lines 105 may include stacked layers (WN/W) of titanium nitride (TiN), tungsten nitride (WN), or tungsten. The word lines 105 may be spaced apart from the buried bit lines 104. To this end, an insulation layer (not illustrated) may be further formed between the word lines 105 and the buried bit lines 104. The insulation layer may include a silicon oxide. In an exemplary embodiment, the word lines 105 may extend in the second direction the Y direction) and surround the sidewalls of the pillar 103. Furthermore, after a gate electrode, surrounding the sidewalls of the pillar 103 is formed, the word lines 105 are connected to the gate electrode.

Figure 2C:
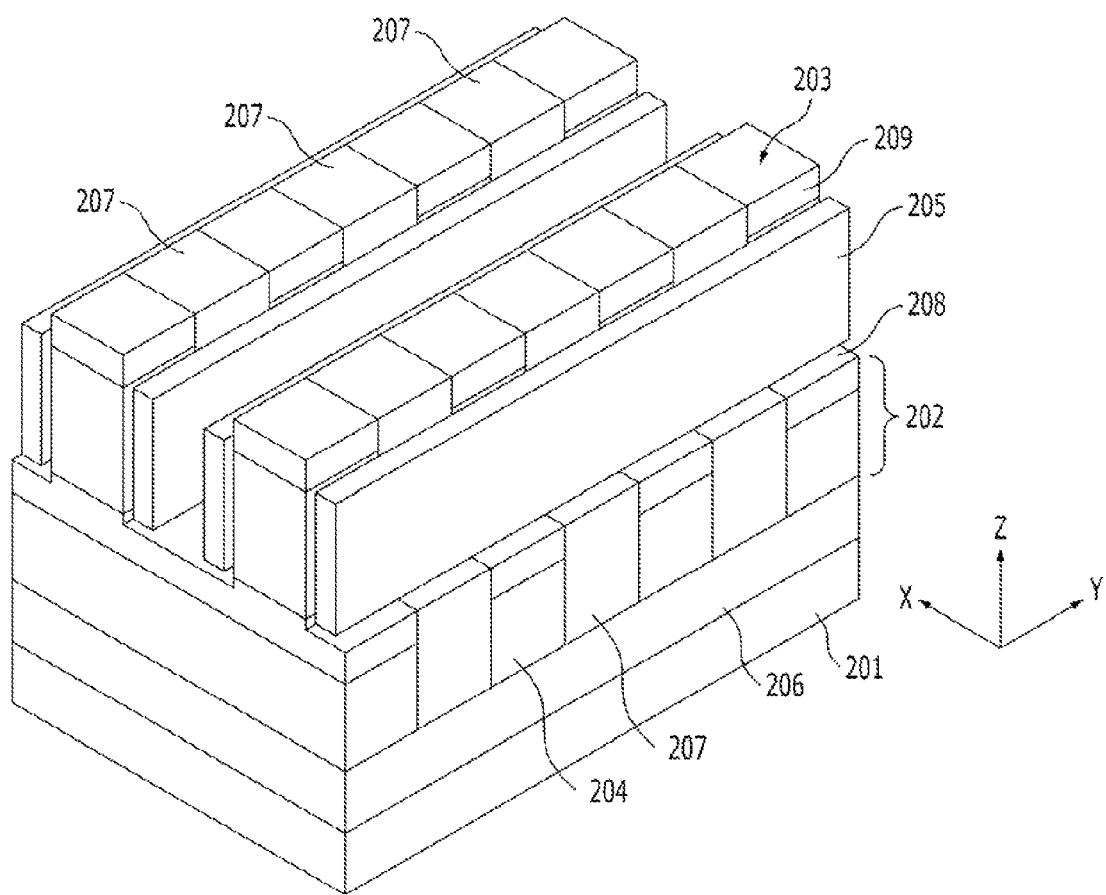
FIG. 2C is a diagram illustrating a semiconductor device with a buried bit line in accordance with an exemplary embodiment.

Referring to FIG. 2C, an exemplary semiconductor device includes buried bit lines 204, pillars 203, and word lines 205. A plurality of active regions, each having a vertical structure including a body 202 and a pillars 203, are formed on a semiconductor substrate 201. Supporters 207 are buried among the plurality of active regions, respectively. The buried bit lines 204 are buried in the bodies 202, respectively.

The semiconductor substrate 201 may include a silicon-containing material, such as a single crystalline silicon substrate. The body 202, the pillar 203, and the semiconductor substrate 201 may include substantially the same material. Thus, the body 202 and the pillar 203 may include a silicon-containing material, such as a single crystalline silicon.

An active region has a linear structure and Includes a body 202 and a pillar 203 formed on the body 202. Multiple pillars 203 may be formed on a common body 202. Each body 202 may have a linear structure formed on the semiconductor substrate 201. The body 202 and the pillars 203 are formed substantially perpendicular to the surface of the semiconductor substrate 201. For example, the body 202 and the pillars 203 may be perpendicular to each other. The plurality of pillars 103 are separated from one another on the body 202. For example, the pillars 203 may have matrix array arrangement. Each pillar 203 may include a channel region of a vertical channel transistor. Furthermore, each pillar 203 may include a first source/drain region 208, a second source/drain region 209, and a channel region of the vertical channel transistor. The first source/drain region 208 may be connected to corresponding buried bit line 204, between the first source/drain region 208 and the second source/drain region 209. The second source/drain region 209 may be connected to a capacitor. The first source/drain region 208, the channel region, and the second source/drain region 209 may be connected to one another in a direction substantially perpendicular to the surface of the substrate 201. The first source/drain region 208, the channel region, and the second source/drain region 209 may form a NPN junction or a PNP junction.

The bodies 202 are formed in a direction substantially perpendicular to the surface of the semiconductor substrate 201. The bodies and the 202 buried bit line 204 may extend in a first direction an X direction). As will be described later, the bodies 202 may be formed by bisecting the linear active region.

Supporters 207 are buried between the bodies 202. Each supporter 207 may be buried in a trench. That is, adjacent bodies 202 are separated by the trench and the supporter 207 is buried in the trench. A supporter 207 may include an insulation material. The supporter 207 may extend parallel to the body 202. Furthermore, the supporter 207 may extend perpendicular to the surface of the substrate (the Z direction), so that the supporter 207 is formed between adjacent pillars 203. The active region, including the body 202 and the pillar 203, may be separated by the supporter 207. Accordingly, when viewed from the first direction, the pillars 203 and the supporters 106 may be alternately formed.

A buried bit line 204 is buried in the body 202. In order to bury the buried bit line 204 in the body 202, a fully silicided process may be used. The buried bit line 204 may extend in the first direction (the X direction). The buried bit line 204 may include a metallic material, such as a metal silicide. Thus, the buried bit line 104 has a low resistance.

A word line 205 is formed at a sidewall of the pillar 203, wherein the word line 205 is formed vertical to the sidewall of the pillar 203. Accordingly the word line 205 is also called a vertical word line. Word lines 205 are formed at both sidewalls of the pillar 203 and may have a double word line structure. Even in the double word line structure, ends of respective word lines 205 may be connected to each other. Since the pillar 203 is a region in which the channel of the vertical channel transistor is formed, a vertical channel is formed by the word line 205. Consequently, the vertical channel transistor including the word line 205, the first source/drain region 208 the channel region, and the second source/drain region 209 is formed. The word line 205 may extend in the second direction (the Y direction). The word line 105 and the buried bit lines 204 may be formed in a direction in which they cross each other. The word lines 205 may include a metallic material. The word lines 205 may include stacked layers (WN/W) of titanium nitride (TiN), tungsten nitride (WN), or tungsten. The word lines 205 may be spaced apart from the buried bit lines 204. To this end, an insulation layer (not illustrated) may be further formed between the word lines 205 and the buried bit lines 204. The insulation layer may include a silicon oxide. In exemplary embodiment, the word lines 205 may extend in the second direction (the Y direction) and surrounding the sidewalls of the pillar 203. Furthermore, after a gate electrode, surrounding the sidewalls of the pillar 203 is formed, the word lines 205 are connected to the gate electrode.

A punch-through prevention insulation layer 206 for substantially preventing a punch through is formed below the buried bit lines 204. When the punch-through prevention insulation layer 206 includes an insulation layer, the body 202 is formed on a SOI structure.

In accordance with an exemplary embodiment, vertical structures, in which the buried bit lines 104, 104A, and 204 are positioned below the pillars 103 and 203, are formed. Consequently, since it is not necessary to form the buried bit lines 104, 104A, and 204 between the pillars 103 and 203, high integration is possible.

Furthermore, the buried bit lines 104, 104A, and 204 are buried in the bodies 102 and 202, respectively. Consequently, the adjacent buried bit lines 104, 104A, and 204 are sufficiently spaced apart from each other, resulting in the reduction of parasitic capacitance $C_B$ between the adjacent buried bit lines 104, 104A, and 204. In addition, the first source/drain region 108 and 208 are not formed below the buried bit lines 104, 104A, and 204, resulting in the reduction of facing areas between the adjacent buried bit lines 104, 104A, and 204 which have an influence on the parasitic capacitance. Consequently, the parasitic capacitance is further reduced.

Moreover, in an exemplary embodiment, the supporters 106 and 207 are buried between the bodies 102 and 202, respectively, and between the pillars 103 and 203, respectively, so that pattern leaning is substantially prevented. A part of the supporter 106 may extend below the buried bit lines 104, 104A, and 204, to substantially prevent punch between the adjacent buried bit lines 104, 104A, and 204. Alternatively, the punch prevention insulation layer 206 may be formed below the buried bit lines 104, 104A, and 204, to substantially prevent punch between the adjacent buried bit lines 104, 104A, and 204.

FIG. 3A to FIG. 3M are diagrams illustrating an example for forming the buried bit line of an exemplary semiconductor device.

Figure 3A:
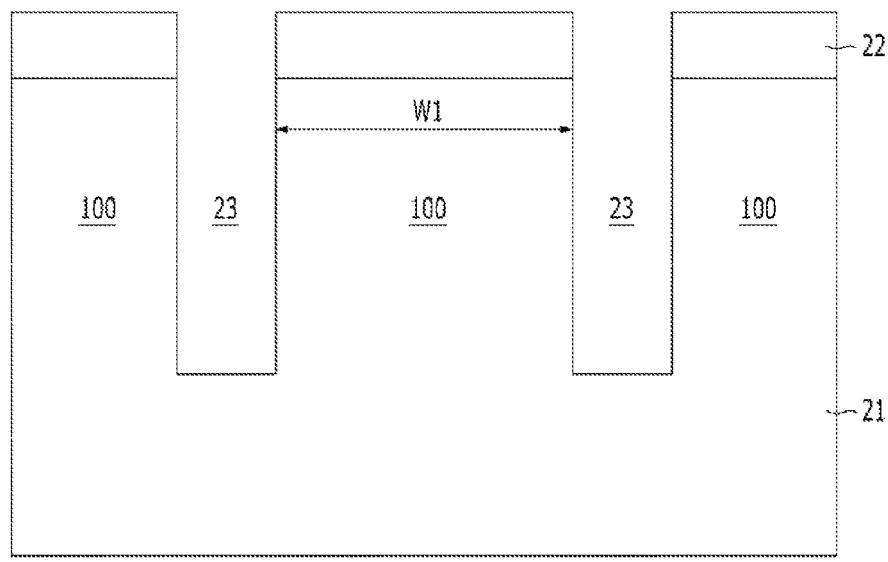
FIG. 3A to FIG. 3M are diagrams illustrating an example for forming a buried bit line of a semiconductor device in accordance with an exemplary embodiment.

As illustrated in FIG. 3A, first mask patterns 22 are formed on a semiconductor substrate 21. The semiconductor substrate 21 may include a single crystalline material, such as single crystalline silicon. The first mask patterns 22 may include silicon nitride. For example, the first mask patterns 22 may be sequentially stacked layers including silicon oxide and silicon nitride. Alternatively, the first mask patterns 22 may also be formed by sequentially stacking, silicon nitride, silicon oxide, silicon oxynitride, or amorphous carbon. When the first mask patterns 22 include silicon nitride, a pad oxide layer (not illustrated) may be further formed between the semiconductor substrate 21 and the first mask patterns 22. The first mask patterns 22 may be formed using a photoresist pattern (not illustrated). The first mask patterns 22 extend in the first direction. The first mask patterns 22 may include a line pattern extending in the first direction.

The semiconductor substrate 21 is etched using the first mask patterns 22 as an etch barrier, so that a plurality of first trenches 23 having a predetermined depth from the upper surface of the semiconductor substrate 21 are formed. The first trenches 23 may extend in the first direction. A plurality of active regions 100, which are separated by the plurality of first trenches 23, are formed. Each of the active regions 100 has a pair of sidewalls. An etching process for forming the first trenches 23 may include an anisotropic etching process. When viewed from the plan view, the active regions 100 are separated by the first trenches 23 and have a linear structure extending in the first direction, which is different from an island active region well-known in the art.

As described above, adjacent active regions, of the plurality of active regions 100 are separated by the first trenches 23. Since each of the active regions 100 has a first line width W1 in consideration of two body lines 29 (refer to FIG. 3E) and a space between the body lines 29, it is possible to substantially prevent the active regions 100 from being leaned when forming the first trenches 23.

Figure 3B:
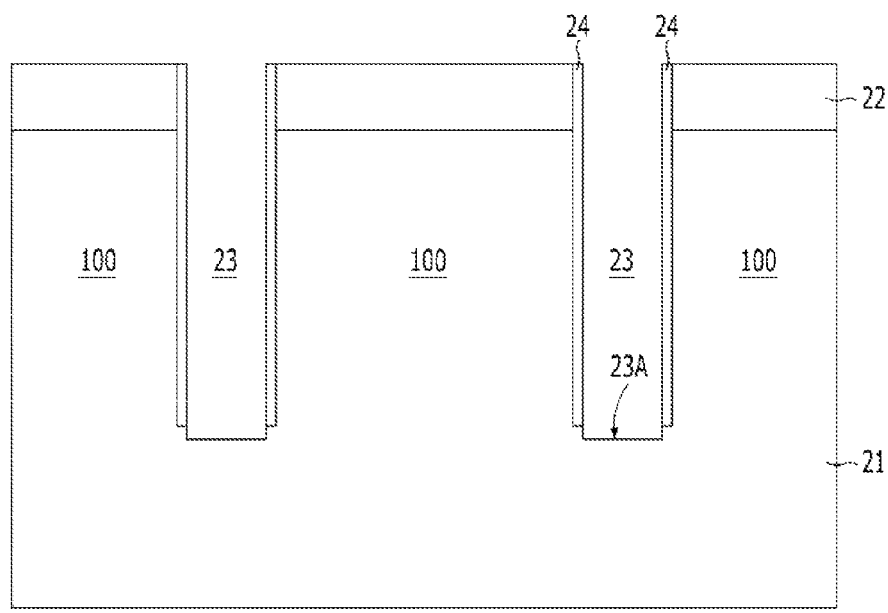

As illustrated in FIG. 3B, spacers 24 are formed on surfaces of inner sidewalls of the active regions and of the first mask patterns defining the first trenches 23. A spacer 24 may include a nitride, such as silicon nitride. In order to form the spacer 24, the nitride may be conformally formed and an etchback process may be performed. In the etchback process for forming the spacers 24, a bottom surface 23A of the first trench 23 may be partially defined in the semiconductor substrate 21. Consequently, a subsequent isotropic etching process may be easily performed.

Figure 3C:
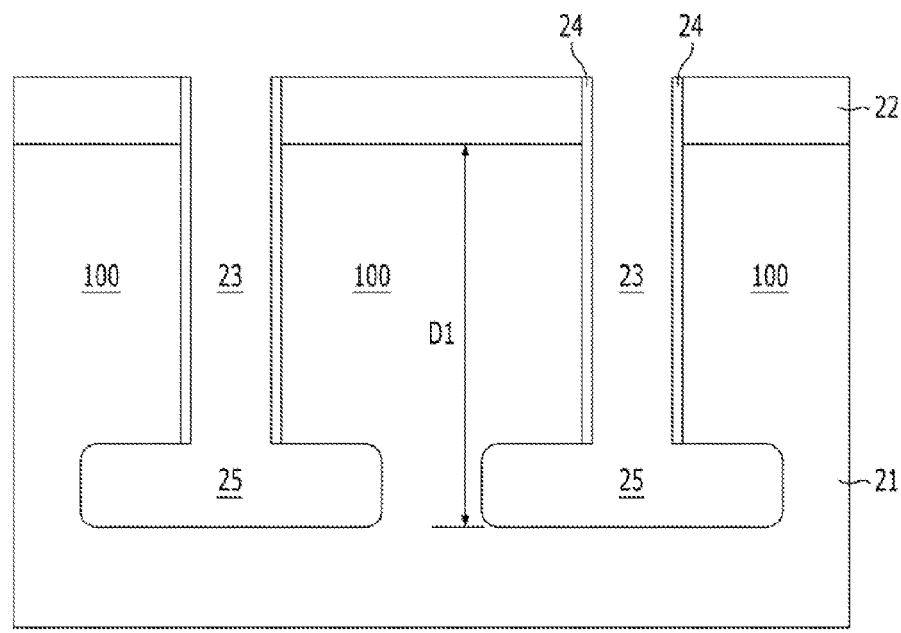

As illustrated in FIG. 3C, an isotropic etching process is performed using the spacers 24 and the first mask patterns 22 as an etch barrier. Thus, the bottom surface 23A of the first trench 23 is selectively etched to form a bulb 25. The first trench 23 and the bulb 25 form a bulb-type trench structure. The bulb 25 may have a curvature. The bottom surface 23A of the first trench 23 is isotropically etched through the isotropic etching process, so that it is possible to form a bulb 25 having a curvature. Using the isotropic etching process, it is possible to adjust an etch amount in a sidewall direction at a lower portion of the active regions 100. The formation of the bulb 25 causes an increase in the height of the active regions 100. The bulb 25 may have a depth of about 20 nm to about 30 nm. The depth of the bulb 25 may be a depth for substantially preventing a punch-through between adjacently buried bit lines. As will be described later, even though the depth of the bulb 25 for substantially preventing punch-through is narrow, since an insulation material is buried in the bulb 25, it is possible to sufficiently prevent the punch-through.

As described above, the bulb 25 is formed so that the plurality of active regions 100 are separated by the bulb-type trench including the first trench 23 and the bulb 25. Even though the height (a reference numeral D1, shown in FIG. 3C) of the first trench 23 and the bulb 25 is deep, since the line width of the active regions 100 is large, the active regions 100 are not leaned. The height D1 of the bulb-type trench is smaller than the height H, shown in FIG. 1. This is because the depth of the bulb 25 for substantially preventing punch-through is narrow. When viewed from the plan view, the plurality of active regions 100 are separated by the bulb-type trench and extend in the first direction. A lower sidewall of the active regions 100 is recessed by the bulb 25. That is, the active regions 100 have a recessed sidewall. The first mask patterns 22 remain on the active regions 100. The trench 24 remain at both sidewalls of the active regions 100.

Figure 3D:
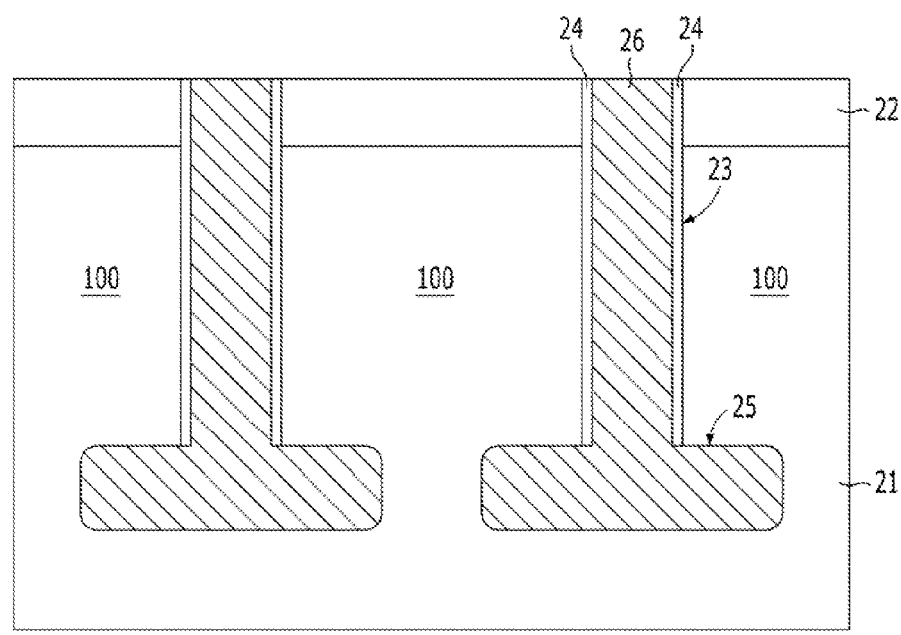

As illustrated in FIG. 3D, a supporter 26 is formed to fill the bulb-type trench including the first trench 23 and the bulb 25. The supporter 26 may include an insulation material. For example, the supporter 26 may include a material with a low dielectric constant, such as silicon oxide. In order to form the supporter 26, the bulb-type trench may be filled with a silicon oxide and then a planarization process may be performed. The planarization process may include an etchback process or a CMP process.

The supporter 26 is buried between adjacent active regions 100. Consequently, when the body lines 29 are formed (in a subsequent process of etching the active regions 100), the supporter 26 firmly supports the body lines 29, so that it is possible to substantially prevent the body lines 29 from leaning (refer to FIG. 3E). A lower portion of the supporter 26 is buried in the bulb 25 and thus is buried in the recessed sidewall of the active regions 100. It is possible for a part of the supporter 26 buried in the bulb 25 to substantially prevent punch-through between adjacently buried bit lines.

Figure 3E:
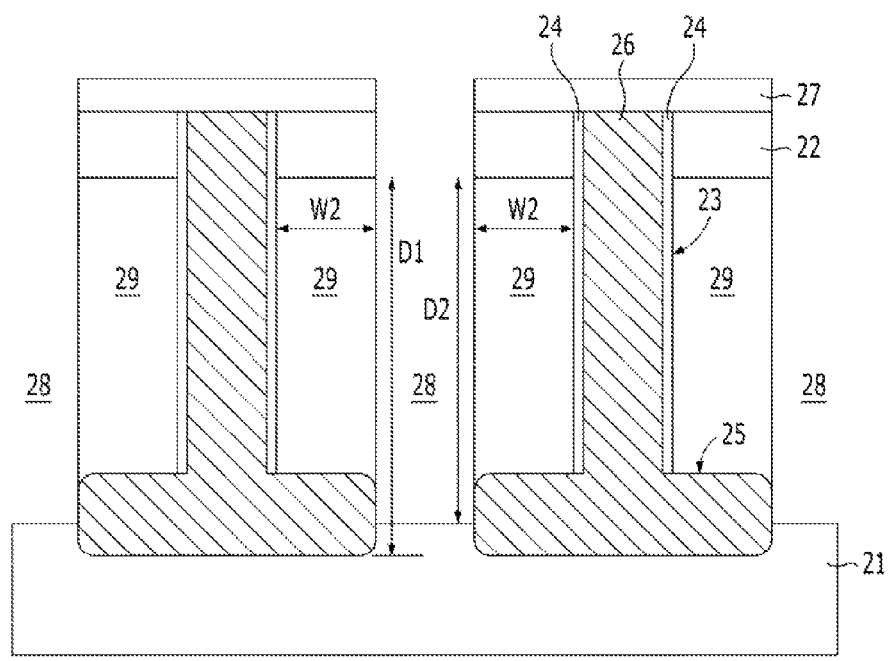

As illustrated in FIG. 3E, a second mask pattern 27 is formed on each of the supporters 26 and on the first mask patterns 22. The second mask pattern 27 may include a line pattern extending in the first direction. A part of a first mask pattern 22 is exposed through a line-shaped space between two adjacent second mask patterns 27. A center portion of the first mask pattern 22 is exposed through the space between the second mask patterns 27.

As described above, the second mask patterns 27 are patterned to cover at least the upper portion of the supporter 26 and to expose the center portion of the first mask pattern 22.

The second mask patterns 27 may be formed using a material, such as amorphous carbon capable of providing etching selectivity relative to the first mask patterns 22. In order to form the second mask patterns 27, a photolithography process may be used.

The exposed first mask pattern 22 and the active regions 100, below the exposed first mask pattern 22, are etched using the second mask patterns 27 as an etch barrier. Thus, second trenches 28 are formed, and the active regions 100 are bisected into the two body lines 29 by the second trench 28. The body lines 29 may provide a channel region of the vertical channel transistor. The body lines 29 may have a second line width W2. The second line width W2 may have a width of ⅓ with respect to the first line width W1 of the active region 100. The second trench 28 has a second depth D2 that may be less than the depth D1 of the bulb-type trench. The bottom surface of the second trench 28 may have a width capable of separating the supporters 26 buried in the bulbs 25 of the bulb-type trenches.

As described above, the active regions 100 are bisected to form the body lines 29, so that a plurality of body lines 29 are formed substantially perpendicular to the surface of the semiconductor substrate 21. That is, a pair of body lines 29 are formed by the second trench 28 that bisects the active regions 100. Some of the plurality of body lines 29 are formed at both sides of the supporter 26. That is, the supporter 26 may be positioned by a pair of adjacent body lines 29. The active regions 100 are separated from each other by the bulb-type trench, and the body lines 29 are separated from each other by the second trench 28.

When the body lines 29 are formed, since the body lines 29 are firmly supported by the supporters 26, pattern leaning does not occur.

Figure 3F:
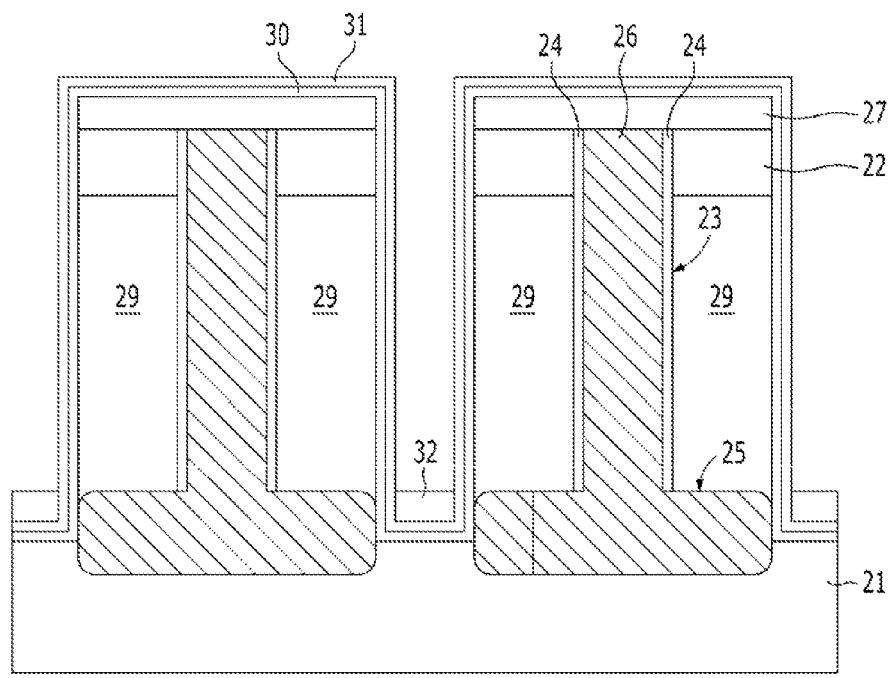

As illustrated in FIG. 3F, protective layers are formed over a resultant structure including the body lines 29. The protective layers may be formed by stacking a first protective layer 30 and a second protective layer 31. The first protective layer 30 and the second protective layer 31 may include an oxide, a nitride, silicon, titanium (Ti), cobalt (Co), ruthenium (Ru), aluminum (Al), copper (Cu), or tungsten (W). The first protective layer 30 should have an etching selectivity that is higher than an etching selectivity of the second protective layer 31. Therefore, the first protective layer 30 and the second protective layer 31 are formed using different materials. For example, if an oxide layer is used as the first protective layer 30, then the second protective layer 31 may use a material having an etching selectivity that is less than an etching selectivity of the oxide layer. For example, if the first protective layer 30 is an oxide layer, then the second protective layer 31 may be a nitride layer.

A first sacrificial layer 32 is formed on the second protective layer 31 to partially gap-fill the second trench 28. The first sacrificial layer 32 may include a material having an etching selectivity that is higher than an etching selectivity of the first and second protective layers 30 and 31. The first sacrificial layer 32 may include an oxide, a nitride, silicon, Ti, Co, Ru, Al, Cu, or W. For the purpose of example, a silicon layer may be used as the first sacrificial layer 32.

In order to form the first sacrificial layer 32 that partially fills the second trench 28, the second trench 28 is filled with the first sacrificial layer 32. Then, a chemical mechanical polishing (CMP) process and an etchback process may be sequentially performed. In the etchback process, the second protective layer 31 is not etched because the second protective layer 31 has a lower etching selectivity than the first sacrificial layer 32.

Figure 3G:
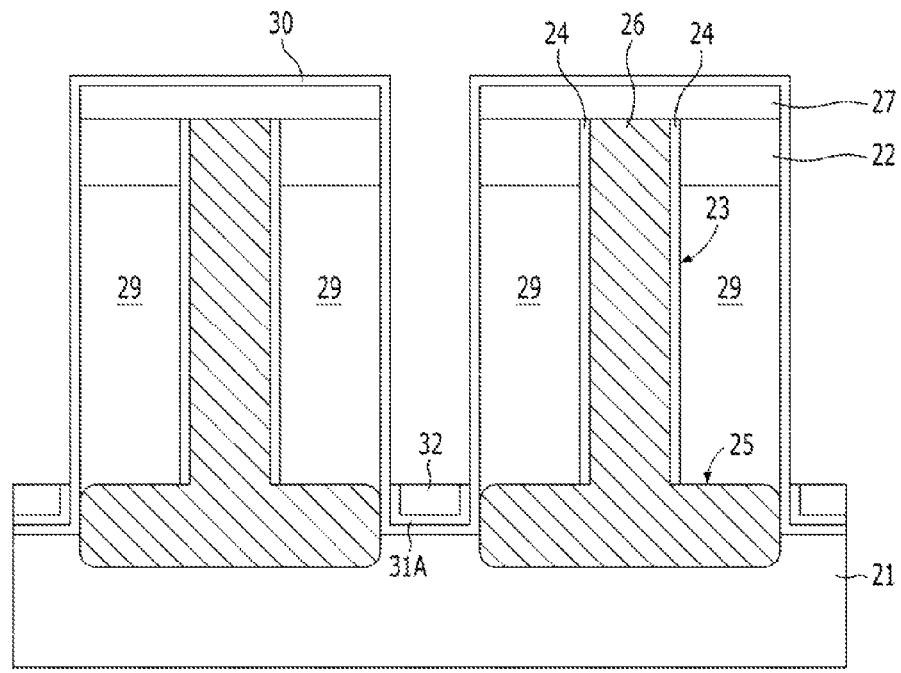

As illustrated in FIG. 3G, the second protective layer 31, which was exposed by the removal of the first sacrificial layer 32, is selectively removed, so that a second protective pattern 31A, having substantially the same height as that of the first sacrificial layer 32 is formed. In order to selectively remove the second protective layer 31, a wet etching process or a dry etching process may be used. The first protective layer 30 formed at the sidewall of the second trench 28 may be exposed by the second protective pattern 31A.

Figure 3H:
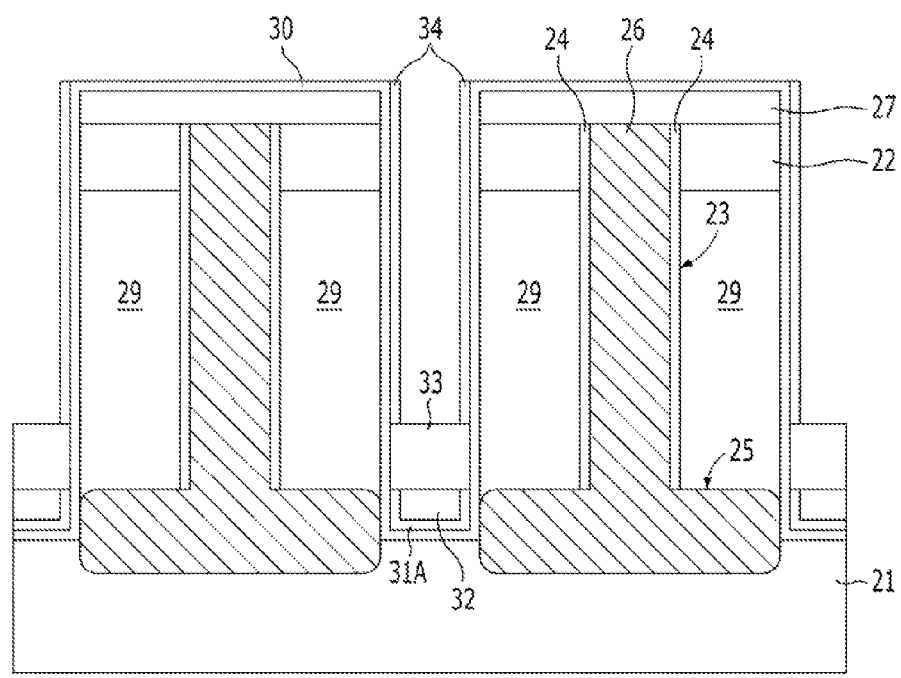

As illustrated in FIG. 3H, the second trench 28 is partially filled with a second sacrificial layer 33. In order to form the second sacrificial layer 33, the second trench 28 is filled with the second sacrificial layer 33, and then a chemical mechanical polishing (CMP) process and an etchback process may be sequentially performed. In the etchback process, the first protective layer 30 is not etched because the first protective layer 30 has an etching selectivity that is lower than the etching selectivity of the second sacrificial layer 33. The second sacrificial layer 33 may include an oxide, a nitride, silicon, Ti, Co, Ru, Al, Cu, or W. The second sacrificial layer 33 may include a different material than the first protective layer 30 in order to have a higher etching selectivity. For example, a silicon layer may be used as the second sacrificial layer 33.

A third protective pattern 34 is formed over the first protective layer 30. The third protective pattern 34 may include an oxide, a nitride, silicon, Ti, Co, Ru, Al, Cu, or W. The third protective pattern 34 is made of a material having a higher etching selectivity than an etching selectivity of the first protective layer 30. For example, if the first protective layer 30 is an oxide layer, the third protective pattern 34 may by a nitride layer.

The third protective pattern 34 may be prepared in the form of a spacer. A third protective layer (not illustrated) may be formed over the first protective layer 30 and then a spacer etching process may be performed. The third protective pattern 34 covers the sidewalls of the body line 29 above the second sacrificial layer 33. The third protective pattern 34 covers the first protective layer 30. The upper surface of the second sacrificial layer 33 is exposed since the third protective pattern 34 is prepared in the form of a spacer.

Figure 3I:
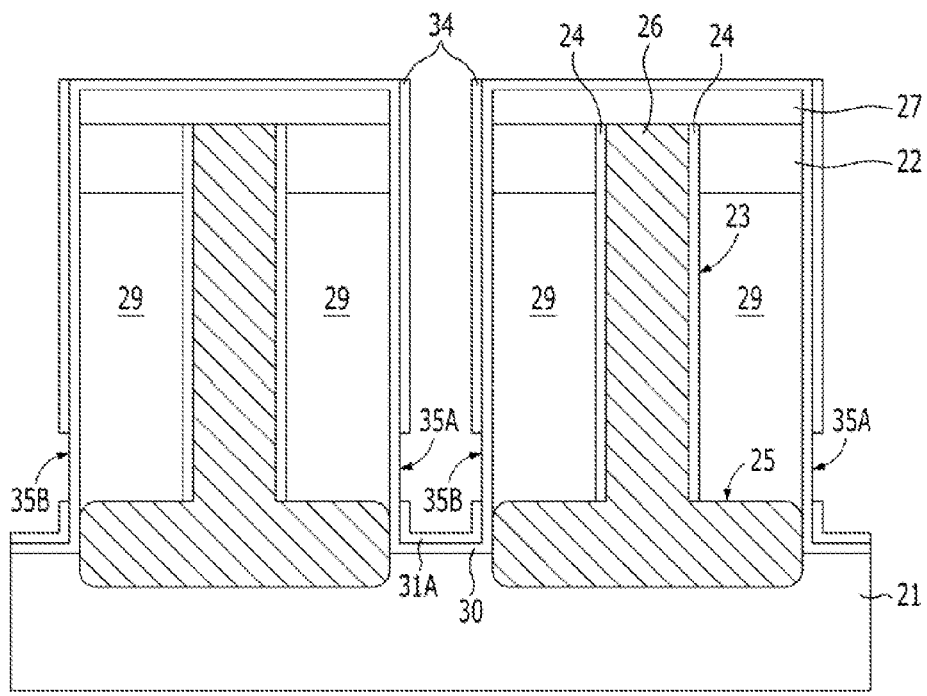

As illustrated in FIG. 3I, the second sacrificial layer 33 is selectively removed using a dry etching process or a wet etching process. When the second sacrificial layer 33 is removed, the first sacrificial layer 32 may be simultaneously removed.

As described above, the second sacrificial layer 33 is removed, so that preliminary openings 35A and 35B are formed between the third protective pattern 34 and the second protective pattern 31A. The preliminary openings 35A and 35B expose a part of the first protective layer 30. The preliminary openings 35A and 35B are opened in the form of a line extending along the sidewalls of the body lines 29. Particularly, the preliminary openings 35A and 35B are simultaneously opened at the sidewalls of adjacent body lines 29.

Figure 3J:
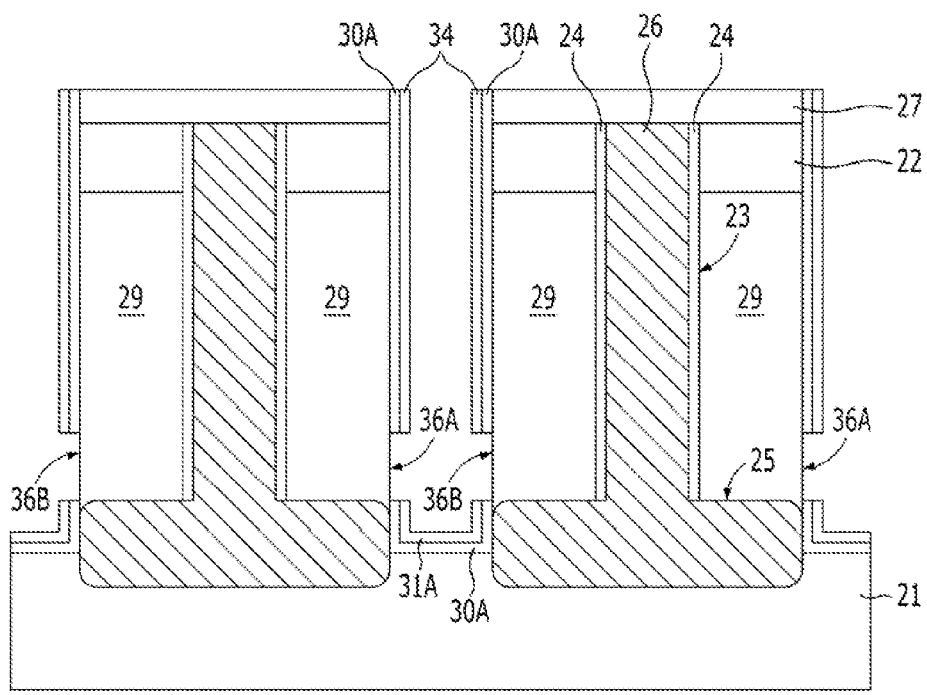

As illustrated in FIG. 3J, a part of the first protective layer 30 exposed by the preliminary openings 35A and 35B are selectively removed, so that openings 36A and 36B are formed to expose portions of the sidewalls of the body lines 29. An upper portion of the sidewalls of the body lines 29, above the openings 36A and 36B, are covered by a first protective pattern 30A, the second protective pattern 31A, and the third protective pattern 34. A lower portion of the sidewalls of the body lines 29, below the openings 36A and 36B, are covered by the first protective pattern 30A and the second protective pattern 31A. When the openings 36A and 36B are formed, the first protective layer 30 formed on the second mask patterns 27 may also be simultaneously removed.

The openings 36A and 36B may be opened in the form of a line extending along the sidewalls of the body lines 29. Particularly, the openings 36A and 36B are simultaneously formed at the sidewalls of adjacent body lines 29 separated by the second trench 28. The openings 36A and 36B will be referred to as both side contacts (BSCs).

Since a part of the supporter 26 fills the bulb 25 at the lower portion of the body lines 29 and the supporter 26 includes an insulation layer, the body lines 29 are formed on the silicon-on-insulator (SOI) structure.

Figure 3K:
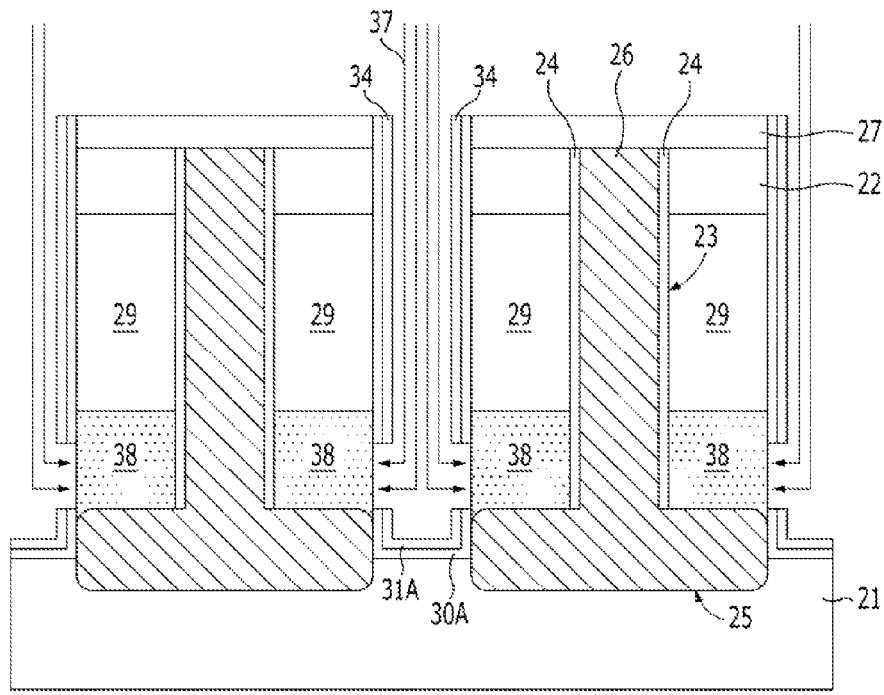

As illustrated in FIG. 3K, a first source/drain region 38 is formed in the body line 29. In order to form the first source/drain region 38, a plasma doping 37 may be performed. At this time, the portions of the sidewalls of the body line 29 exposed by the openings 36A and 36B are doped, so that the first source/drain region 38 is formed. The first source/drain region 38 becomes a source/drain region of the vertical channel transistor.

The plasma doping 37 is a doping method in which doping source is excited in a plasma state, and dopant ions in the excited plasma are implanted into a specimen. At this time, when a bias voltage is applied to the specimen, the dopant ions in the plasma may be doped on the entire surface of the specimen at a time. The bias voltage is also called doping energy.

The plasma doping 37 is performed using doping energy, a doping dose, and a doping source.

The doping source is a material containing a dopant that will be doped into the first source/drain region 38. The doping source includes dopant gas containing, for example, arsenic (As) or phosphorous (P). For example, the doping source includes arsine ($AsH_3$) or phosphine ($PH_3$). The phosphorous (P) and the arsenic (As) are well-known N-type dopants. Furthermore, the doping source may use a dopant gas containing boron (B), which is a well-known as P-type dopant.

The doping energy indicates the bias voltage that is applied to the semiconductor substrate 21. The doping energy is also applied to the body lines 29. As a result, the plasma doping 37 is possible in a lateral direction. Furthermore, the plasma doping 37 is also possible in the lateral direction by a collision of ions in the excited plasma.

The doping dose indicates the amount of implanted dopant. The doping dose is set to about $1\times10^5$ atoms/cm$^2$ to about $1\times10^{17}$ atoms/cm$^2$. When the plasma doping 37 is performed using the doping dose in such a range, dopant doped in the first source/drain region 38 has a doping concentration of $1\times10^{20}$ atoms/cm$^3$ or more.

Gas for exciting plasma for the plasma doping 37 may be flown. The gas for exciting plasma, may include argon (Ar), helium (He), or the like.

As described above, the plasma doping 37 is possible without a shadow effect due to a peripheral structure. Consequently, it is possible to form the first source/drain region 38 at a desired position.

Alternatively the first source/drain region 38 using doped polysilicon that has been in situ doped. For example, the doped polysilicon may be subject to annealing, so that a dopant in the doped polysilicon may be diffused into the body lines 29. Alternatively, the first source/drain region 38 may be formed using tilt ion implantation.

The first source/drain region 38 may be positioned above the bulb 25, so that adjacent first source/drain regions 38 can be isolated by the supporter 26. Since the supporter 26 is positioned below the first source/drain region 38, it is possible to control a depletion region.

Figure 3L:
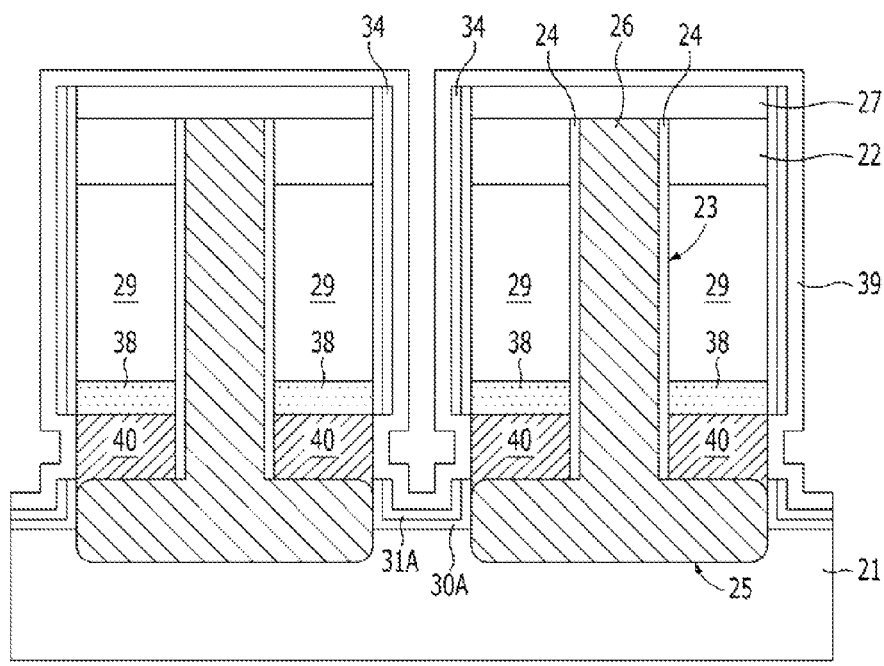

As illustrated in FIG. 3L, a metal layer 39 is formed over a resultant structure and fills the openings 36A and 36B. The metal layer 39 includes a metal, such as a semiprecious metal or a fireproof metal. The metal layer 39 may include a metal which can be silicided. For example, the metal layer 39 may include cobalt (Co), titanium (TI), tantalum (Ta), nickel (Ni), tungsten (W), platinum (Pt), or palladium (Pd). The metal layer 39 may be formed using chemical vapor deposition (CVD) or atomic layer deposition (ALD). A deposition thickness of the metal layer 39 may be controlled to be a thickness by which at least the openings 36A and 36B are buried. Such a thickness is for enabling full silicidation in a subsequent silicidation process.

An annealing process is performed, so that a silicidation is performed to allow the metal layer 39 to react with the body line 29. Since the metal layer 39 includes a metal and the body line 29 includes a silicon-containing material, a metal silicide 40 is formed by a reaction of the metal layer 39 and the body line 29. The metal silicide 40 may include a cobalt silicide, a titanium silicide, a tantalum silicide, a nickel silicide, a tungsten silicide, a platinum silicide, or a palladium silicide. The annealing process includes a rapid thermal annealing (RTA) process. The rapid thermal annealing (RTA) process may be performed at different temperatures according to a type of material that forms the body line 29 and a type of material that forms the metal layer 39. For example, if the metal layer 39 uses cobalt (Co), an annealing temperature range may be about 400° C. to about 800° C. The metal silicide 40 may be partially silicided or fully silicided (FUSI). Hereinafter, an exemplary embodiment may include a fully silicided metal silicide 40. The silicidation process is performed from one sidewall of each of the body lines 29, so that a part of the body lines 29 exposed by the openings 36A and 36B is fully silicided. Through the fully silicidation process, the metal silicide 40 is buried in the body lines 29.

After the metal silicide 40 is formed, an unreacted conductive layer remains. The metal silicide 40 formed through the silicidation process becomes a buried bit line (BBL). Hereinafter, the metal silicide will be referred to as a buried bit line 40.

Figure 3M:
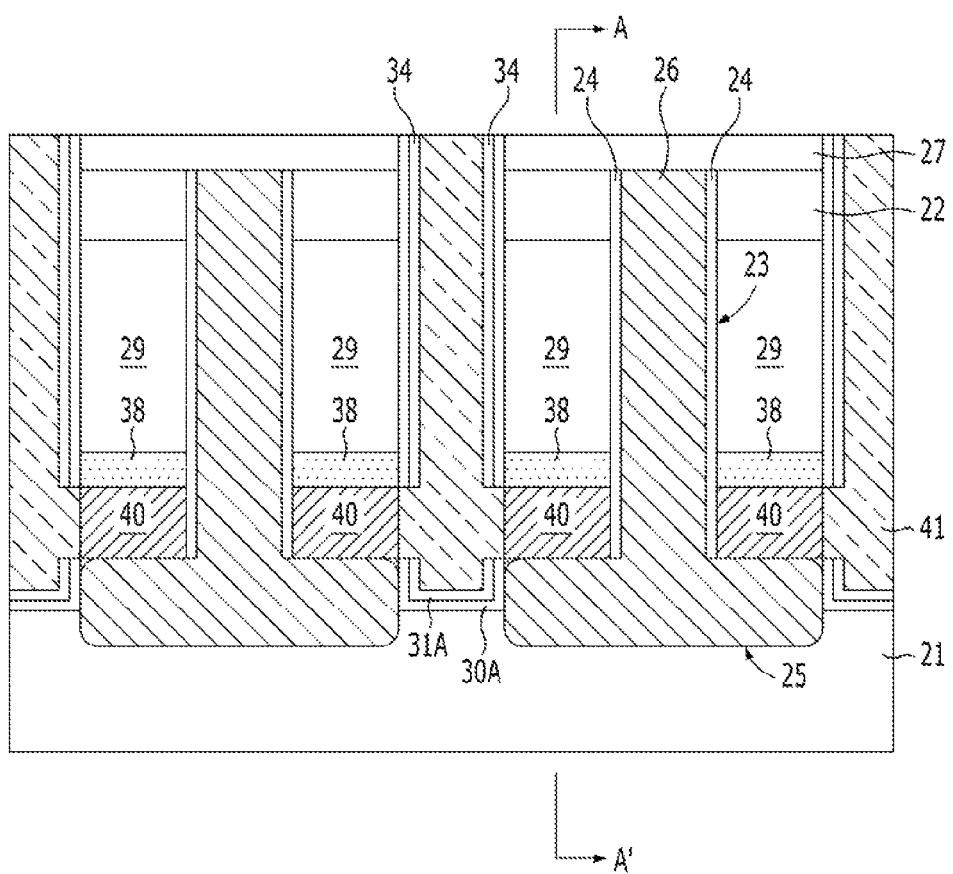

As illustrated in FIG. 3M, the unreacted metal layer is removed. At this time, the unreacted metal layer may be removed using a wet etching process.

Meanwhile, if the metal layer 39 includes cobalt, the rapid thermal annealing (RTA) process is performed at least twice in order to form a cobalt silicide. For example, a primary annealing process and a secondary annealing process are performed. The primary annealing process may be performed at a temperature of about 400° C. to about 600° C. and the secondary annealing process may be performed at a temperature of about 600° C. to about 800° C. As a result of the primary annealing process, a cobalt silicide having a $CoSi_x$ (x=0.1 to 1.5) phase is formed. As a result of the secondary annealing process, the cobalt silicide having the $CoSi_x$ phase is converted to a cobalt silicide having a $CoSi_2$ phase. Among cobalt silicides, the cobalt silicide having the $CoSi_2$ phase has the lowest resistivity. Between the primary annealing process and the secondary annealing process, any unreacted cobalt is removed. The unreacted cobalt may be removed using a mixed chemical of sulfuric acid ($H_2SO_4$) and hydrogen peroxide ($H_2O_2$).

An interlayer dielectric layer 41 is formed over a resultant structure to fill the second trench 28. The interlayer dielectric layer 41 may include an oxide, such as borophosphosilicate glass (BPSG). The interlayer dielectric layer 41 may be subject to a planarization process, so such that the surfaces of the second mask patterns 27 are exposed. Adjacent buried bit lines 40 are isolated from each other by the interlayer dielectric layer 41.

In accordance with an exemplary embodiment, the buried bit lines 40 are formed in the body lines 29. Consequently, adjacent buried bit lines 40 are sufficiently spaced apart from each other by the interlayer dielectric layer 41 and the supporter 26, resulting in the reduction of parasitic capacitance $C_B$ between the adjacent buried bit lines 40. In addition, the first source/drain region 38 is not formed below the buried bit line 40, resulting in the reduction of a facing area. Consequently, it is possible to further reduce the parasitic capacitance between the adjacent buried bit lines 40.

Moreover, the body lines 29 are formed on the SOI structure, so that it is possible to substantially prevent punch-through between the buried bit lines 40. For example, the supporter 26 includes an insulation material extending in the bulb 25 below the buried bit lines 40. Therefore, punch-through between the buried bit lines 40 is substantially prevented. The supporter 26 buried in the bulb 25 uses an insulation material, so that it is possible to sufficiently prevent the punch-through even though the supporter 26 is formed with a thin thickness.

The body lines 29 are formed by bisecting the active regions 100 and are firmly supported by the supporter 26. Furthermore, since the punch-through between the buried bit lines 40 is substantially prevented by the supporter 26, which includes an insulation material, the second trench 28 and the bulb 25 need not be deeply formed. The height of the body line 29, that is, the depth D1 of the bulb-type trench is further smaller than the depth H (shown in FIG. 1). This is because the depth of the bulb 25, for substantially preventing the punch-through, is shallow and the first source/drain region 38 is not formed below the buried bit line 40. Consequently, an aspect ratio is considerably reduced, so that it is possible to form structurally stable body lines 29 with no pattern leaning. For example, the depth 'H' of FIG. 1 is about 340 nm in consideration of a depth 80 nm for substantially preventing the punch-through. However, in the present embodiment, the depth 'D1' is about 280 nm even in consideration of a depth 30 nm for substantially preventing the punch-through.

FIG. 4A to FIG. 4D are diagrams illustrating forming pillars of an exemplary semiconductor device. Hereinafter, a method for forming the pillars refers to a sectional view taken along line A-A' of FIG. 3M.

Figure 4A:
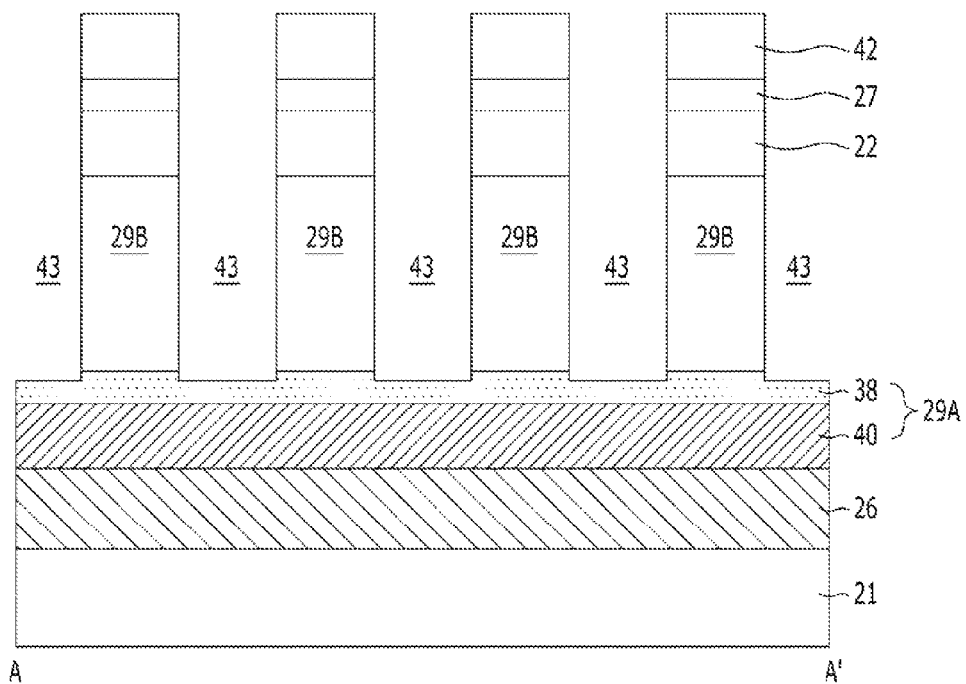
FIG. 4A to FIG. 4D are diagrams illustrating an example for forming a pillar of a semiconductor device in accordance with an exemplary embodiment.

As illustrated in FIG. 4A, third trenches 43 are formed. The third trenches 43 are provided by etching a part of the body lines 29. In order to form the third trenches 43, third mask patterns 42 may be used. The third mask patterns 42 may include a line pattern in a direction in which the third mask patterns 42 cross the body lines 29. The second mask patterns 27 and the first mask patterns 22 are etched using the third mask patterns 42 as an etch barrier, and the body line 29 and the interlayer dielectric layer 41 are etched to a predetermined depth. Thus, the third trenches 43 are formed, so that pillars 29B, separated by the third trenches 43, are formed. The bottom surfaces of the third trenches 43 may reach the first source/drain region 38. The bottom surfaces of the third trenches 43 may not expose the buried bit lines 40. When the third trenches 43 are formed, a part of the supporters 26 may be etched.

As described above, the body lines 29 are etched to form the pillars 29B, and a body 29A is positioned below the pillars 29B. The body 29A is prepared in the form of a line extending in one direction, and a plurality of pillars 29B may be formed on one body 29A.

A buried bit line 40 is formed in the body 29A. A part of the supporter 26 is extended between the buried bit line 40 and the semiconductor substrate 21. The plurality of pillars 29B extend on the body 29A in a direction substantially perpendicular to the surface of the semiconductor substrate 21. The plurality of pillars 29B are formed in units of cells. Thus, the plurality of pillars 29B are formed on one body 29A, and are separated from one another by the third trenches 43. A pillar 29B is a structure in which the channel region of the vertical channel transistor is formed. The pillars 29B may have a matrix array arrangement on the body 29A. Since the body lines 29 include a silicon-containing material, the pillars 29B may include silicon pillars, such as single crystalline silicon pillars. In the body 29A, a part of the first source/drain region 38 and the buried bit line 40 may be formed. An upper surface of the first source/drain region 38 may extend to lower portions of the pillars 29B.

Figure 4B:
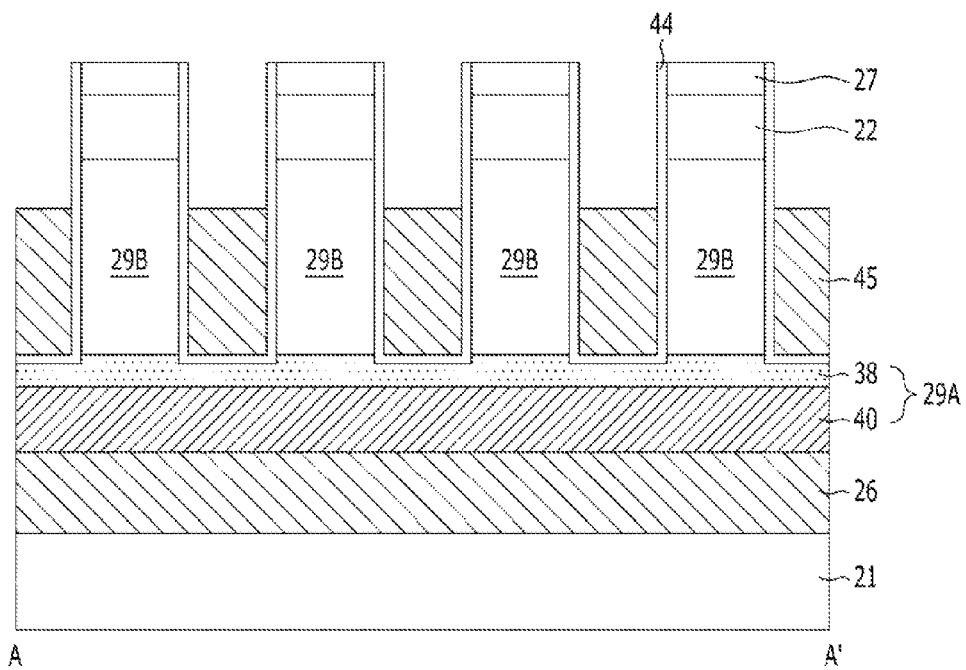

As illustrated in FIG. 4B, after the third mask pattern 42 is removed, a conductive layer 45 is formed to partially fill the third trenches 43. Before the conductive layer 45 is formed, a gate dielectric layer 44 may be formed. The gate dielectric layer 44 may be formed by oxidizing the sidewalls of the pillars 29B and the upper surface of the body 29A. Although not illustrated in the drawing, before the gate dielectric layer 44 is formed, channel ion implantation may be performed. The conductive layer 45 uses a low resistive material, for example, a metallic layer, such as a titanium layer, a titanium nitride layer, or a tungsten layer. The conductive layer 45 may be recessed by sequentially performing a planarization process and an etchback process.

Figure 4C:
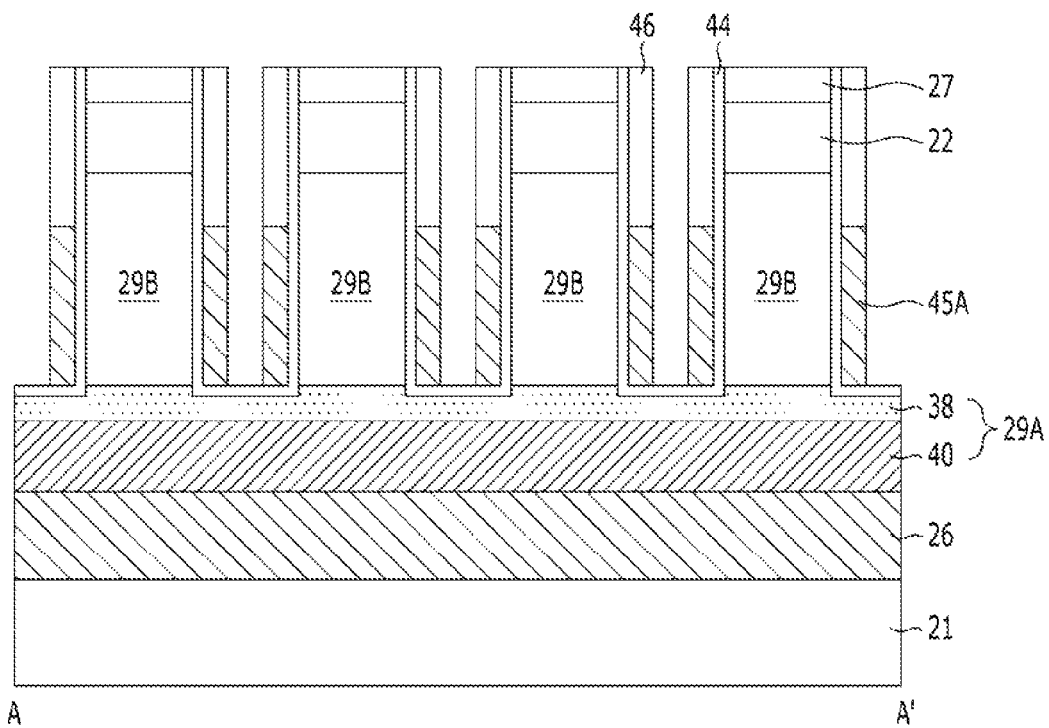

As illustrated in FIG. 4C, an insulation layer is deposited and then an etchback process is performed, so that a spacer 46 is formed. The spacer 46 may include a nitride layer.

The conductive layer 45 is etched using the spacer 46 as an etch barrier, so that word lines 45A are formed at the sidewalls of the pillars 29B. The word lines 45A may be formed in the second direction crossing the buried bit lines 40. The word lines 45A serve as vertical gate electrodes. In an exemplary embodiment, the word lines 45A may be formed to surround the pillars 29B. In an exemplary embodiment, after annular vertical gate electrodes surrounding the pillars 29B are formed, the word lines 45A may be formed to connect adjacent vertical gate electrodes to each other. In an exemplary embodiment, the word lines 45A may be connected to each other through gate contacts after the vertical gate electrodes are formed, and may be formed above the pillars 29B.

Figure 4D:
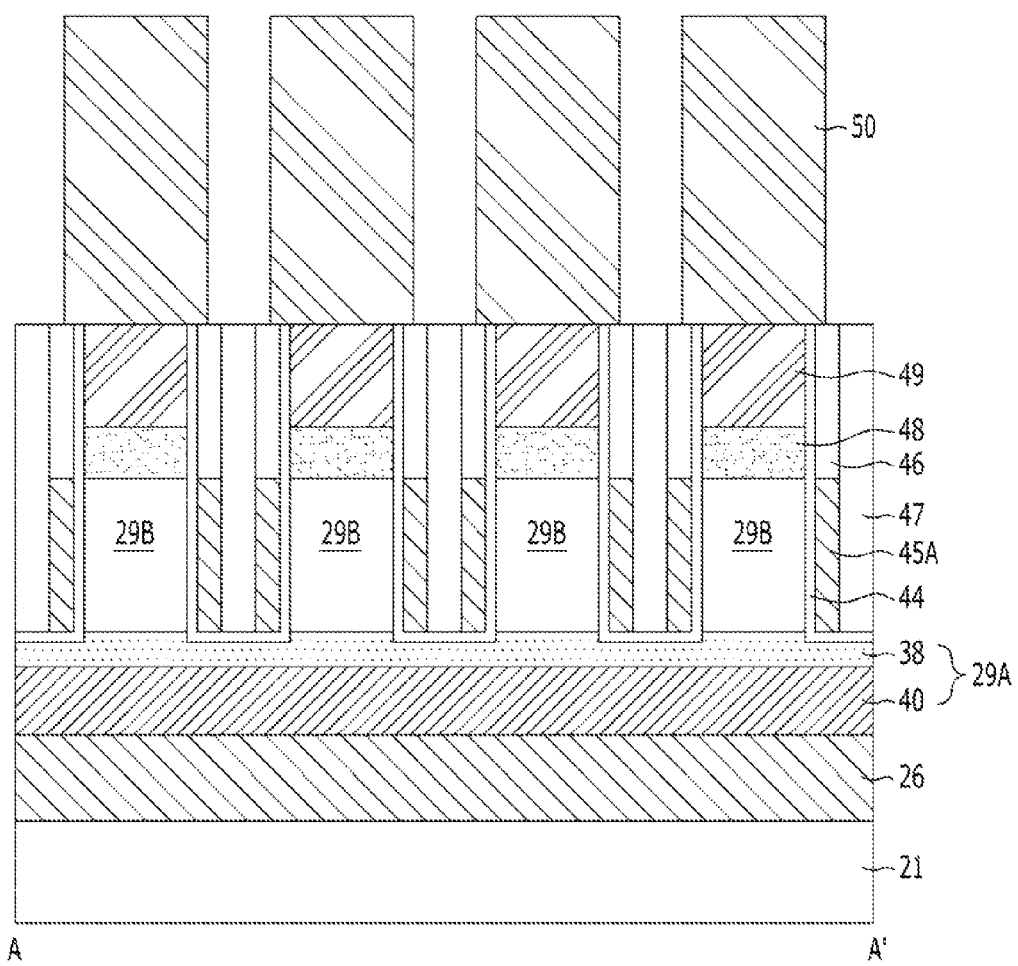

As illustrated in FIG. 4D, a second interlayer dielectric layer 47 is formed to isolate the word lines 45A from each other.

The first mask patterns 22 and the second mask patterns 27 are selectively removed to form contact holes above the pillars 29B. Ions are implanted into the pillars 29B below the contact holes to form a second source/drain region 48. Then, storage node contact plugs 49 are formed to fill the contact holes.

Storage nodes 50 to be a part of a capacitor may be formed on the storage node contact plugs 49, respectively. The storage nodes 50 may be prepared in the form of pillars. In an exemplary embodiment, the storage nodes 50 may be prepared in the form of a cylinder. Although not illustrated in the drawing, a dielectric layer and a top electrode may be subsequently formed on the storage nodes 50.

FIG. 5A to FIG. 5E are diagrams illustrating an example for explaining a method for forming a buried bit line of an exemplary semiconductor device. A method for forming a supporter and an active region refers to FIG. 3A to FIG. 3D.

Figure 5A:
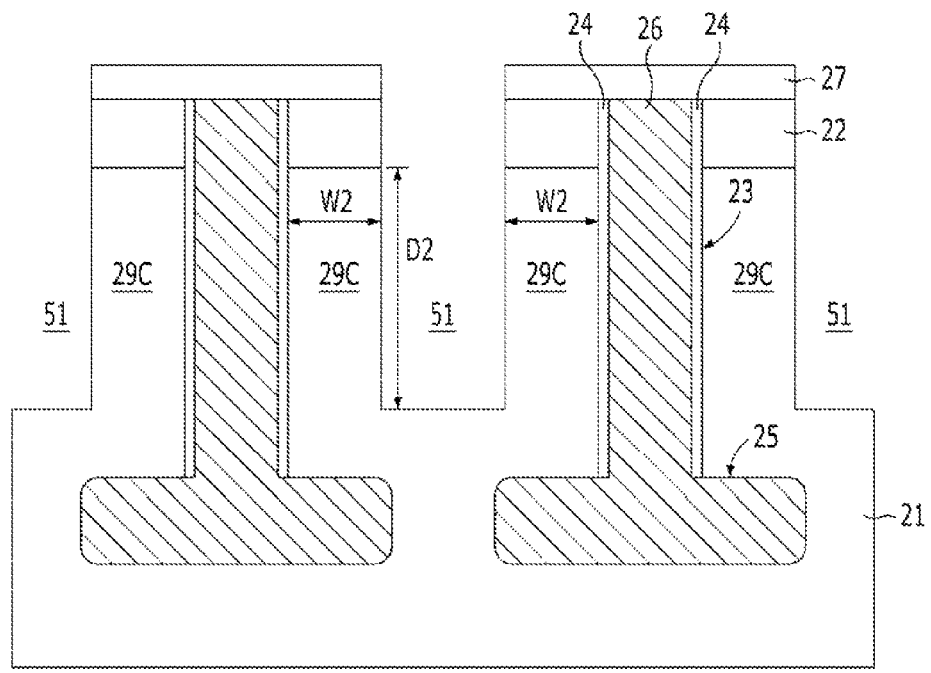
FIG. 5A to FIG. 5E are diagrams illustrating an example for forming a buried bit line of a semiconductor device in accordance with an exemplary embodiment.

As illustrated in FIG. 5A, second mask patterns 27 are formed on the supporter 26 and the first mask patterns 22. The second mask patterns 27 may include a line pattern extending in the first direction. A part of a first mask pattern 22 is exposed through a line-shaped space between two adjacent second mask patterns 27. A center portion of the first mask pattern 22 exposed through the space between the second mask patterns 27 may be exposed.

As described above, the second mask patterns 27 have the line-shaped space patterned to cover at least the upper portion of the supporter 26 and to expose the center portion of the first mask pattern 22.

The second mask patterns 27 may be formed using a material capable of providing etching selectivity to the first mask patterns 22. For example, the second mask patterns 27 may include amorphous carbon. In order to form the second mask patterns 27, a photolithography process may be used.

The exposed first mask pattern 22 and the active regions 100 (see e.g., FIG. 3A) below the exposed first mask pattern 22 are etched using the second mask patterns 27 as an etch barrier, so that second trenches 51 are formed. Then, a part of the active region 100 is etched, and the active region 100 is bisected into two preliminary body lines 29C by the second trench 51. The preliminary body line 29C may have a second line width W2. The second line width W2 may have a width of ⅓ with respect to the first line width W1 of the active region 100. (See e.g., FIG. 3A.) The second trench 51 has a second depth D2, wherein the second depth D2 may be smaller than the depth D1 of the bulb-type trench. (See e.g., FIG. 3C.)

Figure 5B:
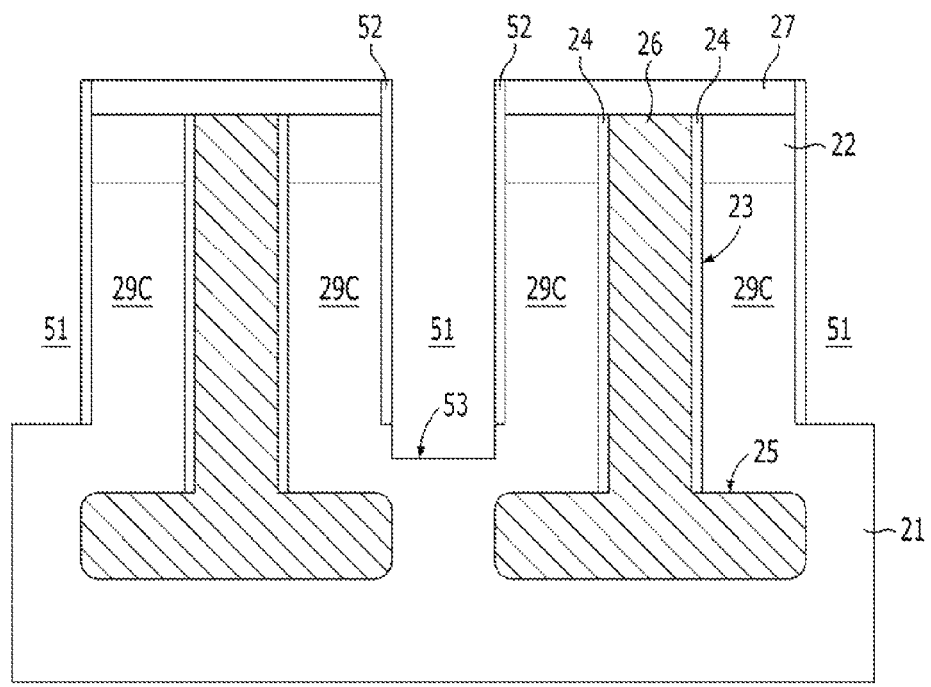

As illustrated in FIG. 5B, spacers 52 are formed at an inner wall of the second trench 51.

The spacers 52 may include a nitride, such as silicon nitride. In order to form the spacers 52, nitride may be conformally formed and an etchback process may be performed. In the etchback process for forming the spacers 52, a bottom surface 53 of the second trench 51 may be partially etched. Consequently, a subsequent isotropic etching process may be easily performed.

Figure 5C:
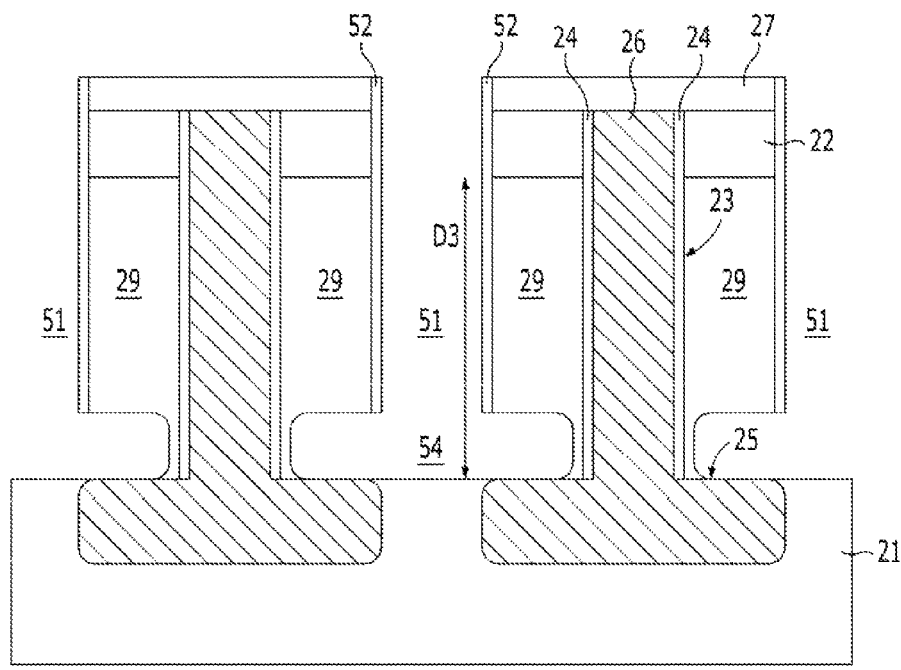

As illustrated in FIG. 5C, the bottom surface 53 of the second trench 51 is isotropically etched to form a bulb 54. Thus, body lines 29 are formed, and are separated by a bulb-type trench including the second trench 51 and the bulb 54. A bulb-type trench, in which the supporter has been buried, will be referred to as a first bulb-type trench, and a bulb-type trench for separating the body lines 29 will be referred to as a second bulb-type trench. The second bulb-type trench has a third depth D3. A lower sidewall of the body line 29 is recessed by the bulb 54. That is, the body line 29 has a recessed lower sidewall. The third depth D3 of the second bulb-type trench may be shallower than the first depth D1 of the first bulb-type trench.

As described above, a pair of body lines 29 are formed by bisecting the active regions 100, so that the body lines 29 are formed substantially perpendicular to the surface of the semiconductor substrate 21. Adjacent body lines 29, formed on different supporters 26, may be separated from each other by the second bulb-type trench, including the second trench 51 and the bulb 54.

When forming the body lines 29, since the body lines 29 are firmly supported by the supporters 26, although a high aspect ratio etching process is performed, pattern leaning does not occur.

Meanwhile, when forming the bulb 54, the supporters 26 may be used to prevent an expansion of the bottom surface of the bulb 54. That is, the supporter 26 may serve as an etch stop layer when forming the bulb 54.

Figure 5D:
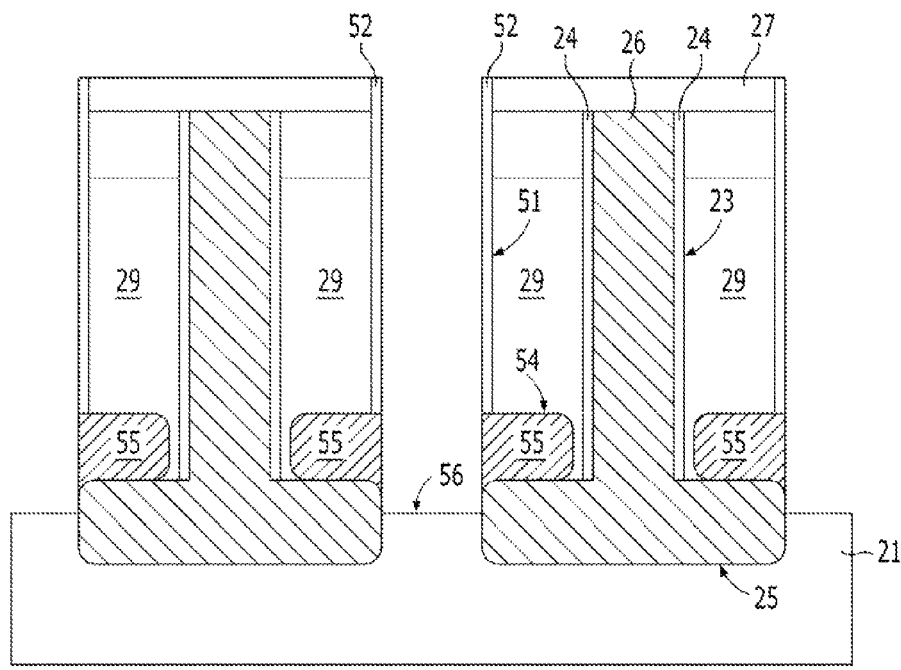

As illustrated in FIG. 5D, a conductive layer (not illustrated) is formed over a resultant structure to fill the bulb 54. The conductive layer may include a metal layer. The conductive layer is subject to a planarization process and an etchback process, so that buried bit lines 55 are buried in the recessed sidewalls of the body lines 29. When the conductive layer is etched back, a part of the semiconductor substrate 21 between the supporters 26 may be recessed by a predetermined depth such that the buried bit lines are sufficiently separated from each other (refer to a reference numeral 56). Through the recessing (56), it is possible to substantially prevent punch between the buried bit lines 55.

Figure 5E:
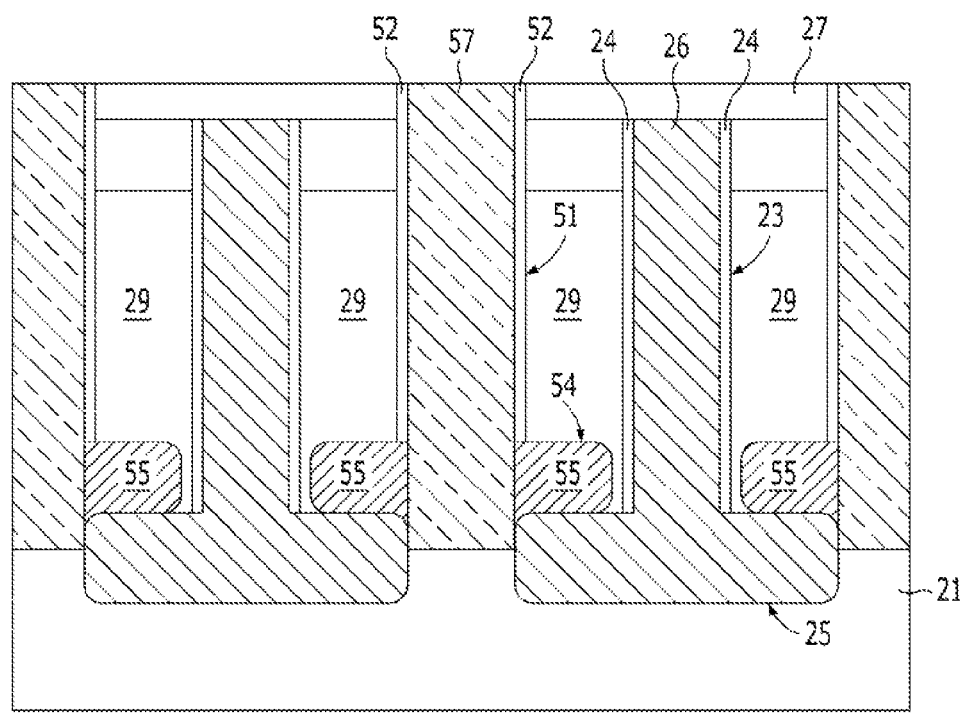

As illustrated in FIG. 5E, the second trench 51 is filled with a first interlayer dielectric layer 57. The first interlayer dielectric layer 57 may include an oxide, such as BPSG. The first interlayer dielectric layer 57 may be subject to a planarization process such that the surface of the second mask patterns 27 is exposed. Adjacent buried bit lines 55 are isolated from each other by the first interlayer dielectric layer 57.

Subsequently, a vertical channel transistor including a pillar and a capacitor may be formed. This refers to FIG. 4A to FIG. 4D.

FIG. 6A to FIG. 6G are diagrams illustrating an example for explaining a method forming a buried bit line of an exemplary semiconductor device.

Figure 6A:
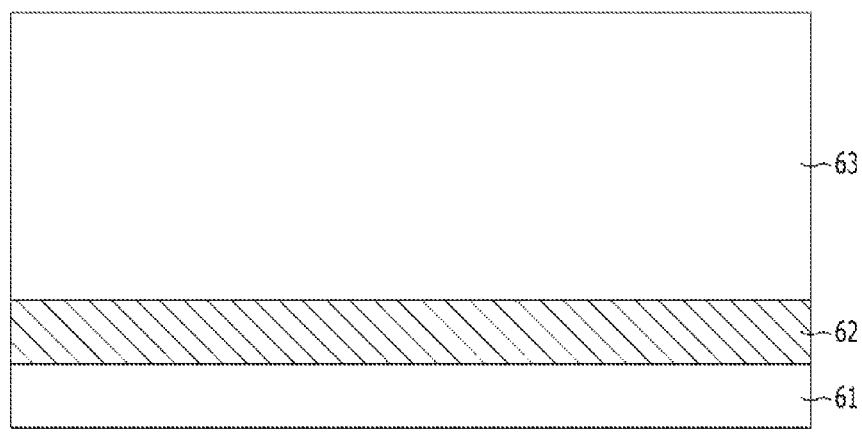
FIG. 6A to FIG. 6G are diagrams illustrating an example for forming a buried bit line of a semiconductor device in accordance with an exemplary embodiment.

As illustrated in FIG. 6A, an insulation layer 62 is formed on a semiconductor substrate 61. The insulation layer 62 may include silicon oxide. A conductive layer 63 is formed on the insulation layer 62. The conductive layer 63 may include a silicon-containing material. The conductive layer 63 may be formed through epitaxial growth. When the semiconductor substrate 61 and the conductive layer 63 include a silicon-containing material, a SOI structure is formed. The semiconductor substrate 61 may include a single crystalline material. The semiconductor substrate 61 includes a silicon-containing substrate, and for example, may include single crystalline silicon. The insulation layer 62 substantially prevents punch-through between buried bit lines. Although not illustrated in the drawing, when forming the conductive layer 63, a NPN junction may be formed. The NPN junction is a junction in which a first source/drain region, a channel region, and a second source/drain region are to be formed.

Figure 6B:
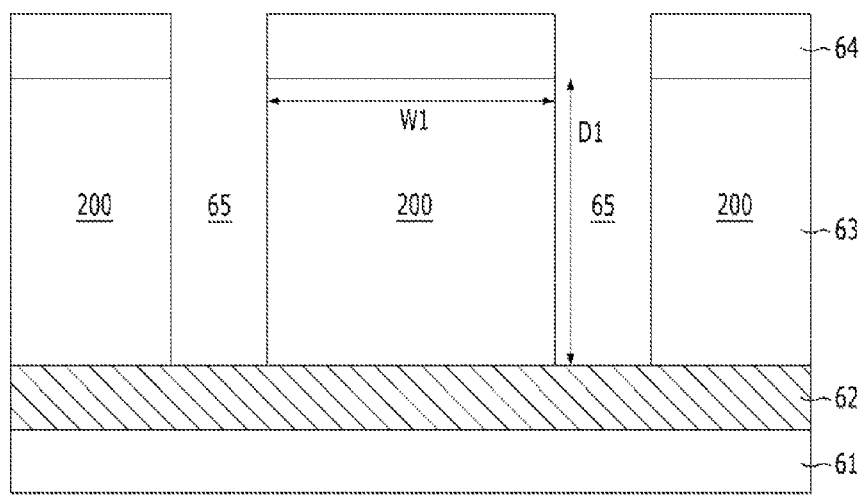

As illustrated in FIG. 6B, a plurality of first mask patterns 64 are formed on the conductive layer 63. The first mask patterns 64 include silicon nitride. The first mask patterns 64 may be stacked layers including silicon oxide and silicon nitride. For example, the first mask patterns 64 may be formed by sequentially stacking silicon nitride and silicon oxide. Alternatively, the first mask patterns 64 may also be formed by sequentially stacking silicon nitride, silicon oxide, silicon oxynitride, or amorphous carbon. When the first mask patterns 64 include silicon nitride, a pad oxide layer (not illustrated) may be further formed between the conductive layer 63 and the first mask patterns 64. The first mask patterns 64 may be formed using a photoresist pattern (not illustrated). The first mask patterns 64 extend in the first direction. The first mask patterns 64 may include a line pattern extending in the first direction.

The conductive layer 63 is etched using the first mask pattern 64 as an etch barrier so that, a plurality of first trenches 65 are formed to expose the surface of the insulation layer 62. The first trenches 65 may extend in the first direction. Active regions 200, separated by the first trenches 65, are formed. Each of the active region 200 has a pair of sidewalls. An etching process for forming the first trenches 65 may include an anisotropic etching process. When viewed from the plan view, the active regions 200 are separated by the first trenches 65 and have a linear structure extending in the first direction. The active region is different from an island active region well-known in the art. The first trenches 65 have a first depth D1.

As described above, the active regions 200 are separated by the first trenches 65. Since the line width of the active region 200 has a first line width W1 in consideration of two body lines 69 (refer to FIG. 6E) and a space between the body lines 69, it is possible to substantially prevent the active region 200 from being leaned when forming the first trenches 65.

Figure 6C:
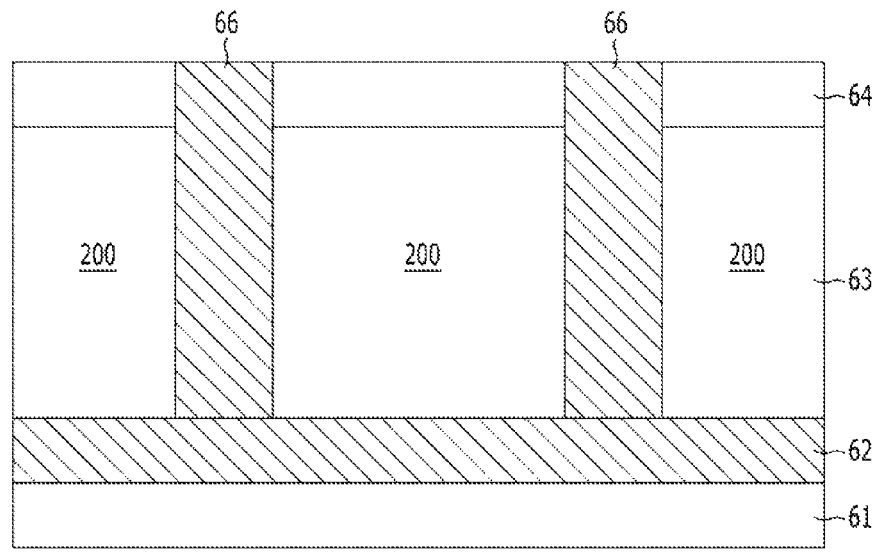

As illustrated in FIG. 6C, supporters 66 are formed to fill the first trenches 65.

The supporters 66 may include an insulation material. For example, the supporters 66 may include oxide, such as silicon oxide. In order to from the supporters 66, after oxide is formed to fill the first trenches 65, a planarization process may be performed. The planarization process may include an etchback process or a CMP process.

The supporters 66 are buried between adjacent active regions 200. Consequently, when the body lines 69 (refer to FIG. 6E) are formed in a subsequent process of etching the active region 200, the supporters 66 firmly support the body line 69, so that it is possible to substantially prevent the body lines from being leaned.

Figure 6D:
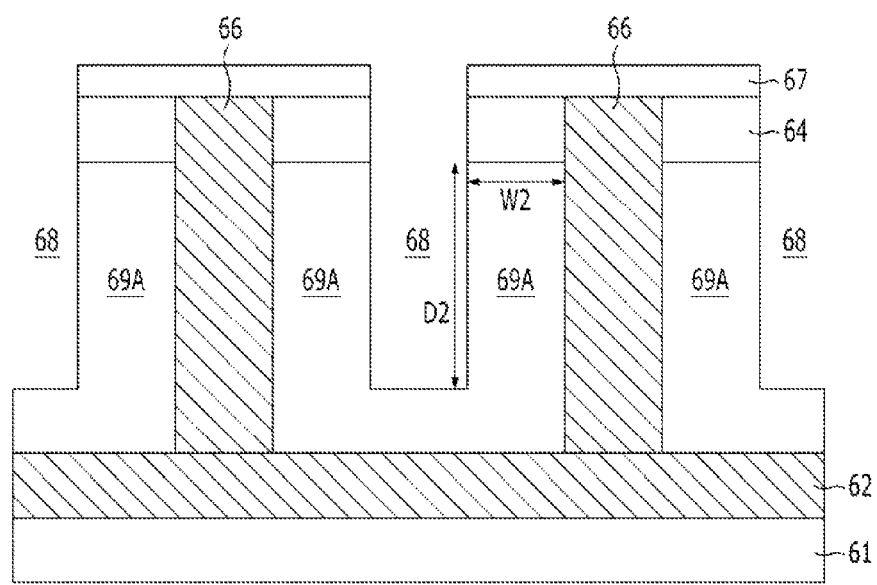

As illustrated in FIG. 6D, a plurality of second mask patterns 67 are formed on the supporters 66 and the first mask patterns 64. The second mask patterns 67 may include a line pattern extending in the first direction. A part of a first mask pattern 64 is exposed through a line-shaped space between two adjacent second mask patterns 67. A center portion of a first mask pattern 64 is exposed through the space between the second mask patterns 67.

As described above, the second mask patterns 67 have the line-shaped space patterned to cover at least the upper portion of a supporter 66 and to expose the center portion of the first mask pattern 64.

The second mask patterns 67 may be formed using a material capable of providing etching selectivity relative to the first mask pattern 64. For example, the second mask patterns 67 may include amorphous carbon. In order to form the second mask patterns 67, a photolithography process may be used.

The exposed first mask pattern 64 and an active region 200 below the exposed first mask pattern 64 are etched using the second mask pattern 67 as an etch barrier, so that second trenches 68 are formed. Then, a part of the active region 200 is etched, and the active region 200 is bisected into the two preliminary body lines 69A by the second trench 68.

The preliminary body lines 69A may have a second line width W2. The second line width W2 may have a width of ⅓ with respect to the first line width W1 of the active region 200. The second trench 68 has a second depth D2, where the second depth D2 may be smaller than the depth D1 of the first trench 65.

Figure 6E:
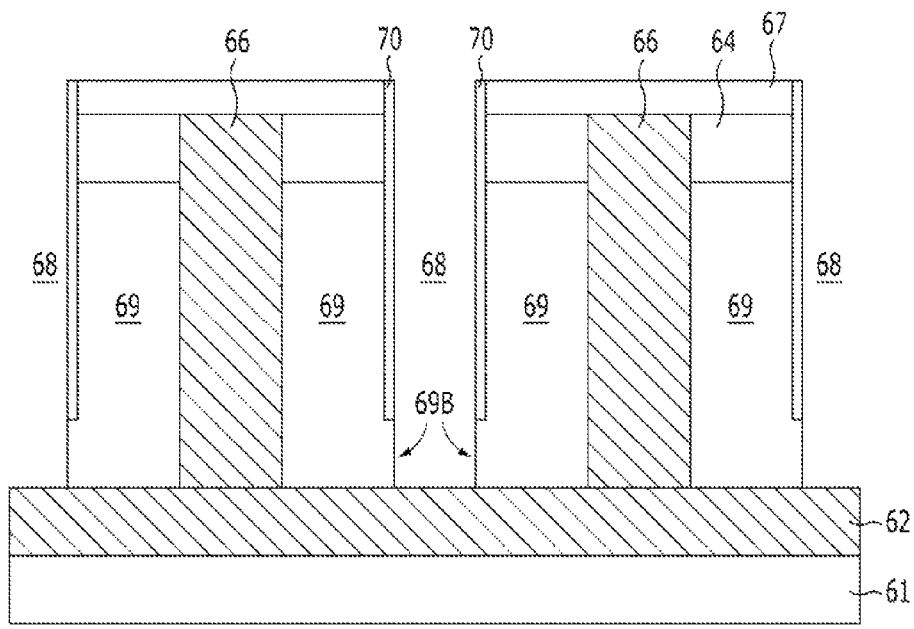

As illustrated in FIG. 6E, spacers 70 are formed at an inner wall of the second trench 68.

The bottom surface of the second trench 68 is etched, so that the depth of the second trench 68 extends, and thus the body lines 69 are formed. The body lines 69 are separated by the second trenches 68. As the depths of the second trenches 68 increase, lower sidewalls 69B of the body lines 69 are exposed by the spacers 70.

As described above, the body lines 29 are formed by bisecting the active region 200, so that the body lines 29 are formed on the insulation layer 62, substantially perpendicular to the surface of the semiconductor substrate 61. Some of the body lines 69 are formed at both sides of the supporters 66. Some of the body lines 69 may be separated by the second trench 68.

When forming the body lines 69, since the body lines 69 are firmly supported by the supporters 66, pattern leaning does not occur even though a high aspect ratio etching process is performed.

Figure 6F:
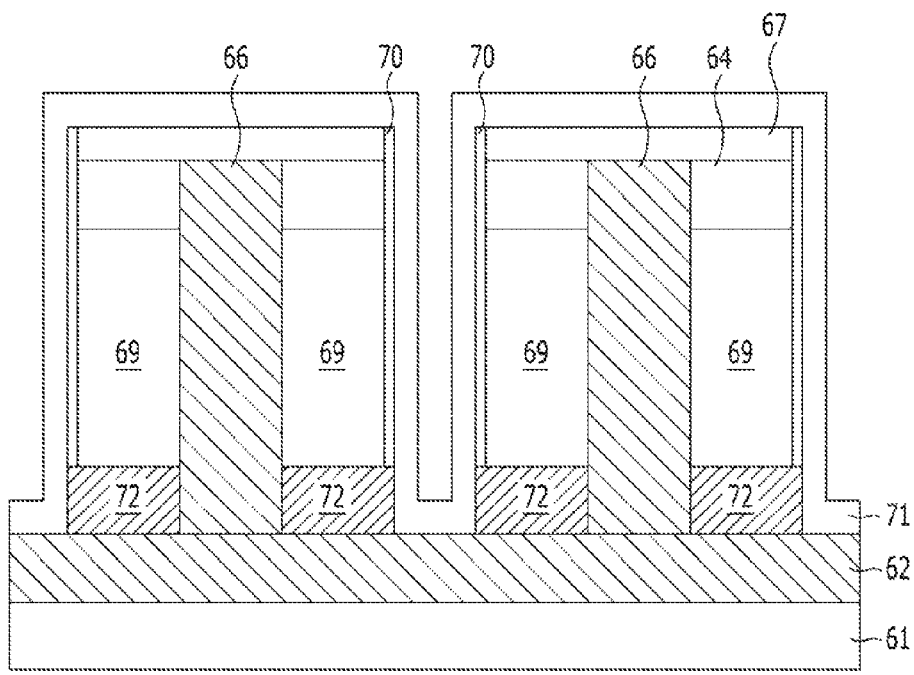

As illustrated in FIG. 6F, a metal layer 71 is formed over a resultant structure. The metal layer 71 includes a metal, such as a semiprecious metal or a fireproof metal. The metal layer 71 includes a metal which can be silicided. For example, the metal layer 71 may include cobalt (Co), titanium (Ti), tantalum (Ta), nickel (Ni), tungsten (W), platinum (Pt), or palladium (Pd). The metal layer 71 may be formed using chemical vapor deposition (CVD) or atomic layer deposition (ALD). The metal layer 71 may have a deposition thickness that can be fully silicided in a subsequent silicidation process.

An annealing process is performed, so that a silicidation process is performed to allow the metal layer 71 to react with the body lines 69. Since the metal layer 71 includes a metal and the body lines 69 include a silicon-containing material, a metal silicide 72 is formed by a reaction of the metal layer 71 and the body lines 69. The metal silicide 72 may include a cobalt silicide, a titanium silicide, a tantalum silicide, a nickel silicide, a tungsten silicide, a platinum silicide, or a palladium silicide. The annealing process includes a rapid thermal annealing (RTA) process. The rapid thermal annealing (RTA) process may be performed at different temperatures according a type of material that forms the body lines 69 and the metal layer 71. For example, if the metal layer 71 uses cobalt (Co), then an annealing temperature range may be about 400° C. to about 800° C. The metal silicide 72 may be partially silicided or fully silicided (FUSI). Hereinafter, an exemplary embodiment includes a fully silicided metal silicide 72. The silicidation process is allowed to be sufficiently performed from the sidewalls of the body lines 69, that the lower sidewalls 69B of the exposed body lines 69 are fully silicided. Through the fully silicidation process, the metal silicide 72 is buried in the body lines 69.

After the metal silicide 72 is formed, an unreacted conductive layer remains. The metal silicide 72 formed through the silicidation process becomes a buried bit line (BBL). Hereinafter, the metal silicide will be referred to as a buried bit line 72.

In an exemplary embodiment, though it is not illustrated, a process for forming the body lines 69 and the buried bit line 72 described in FIG. 6E and FIG. 6F may be replaced with a process described in FIGS. 5B to 5D.

Figure 6G:
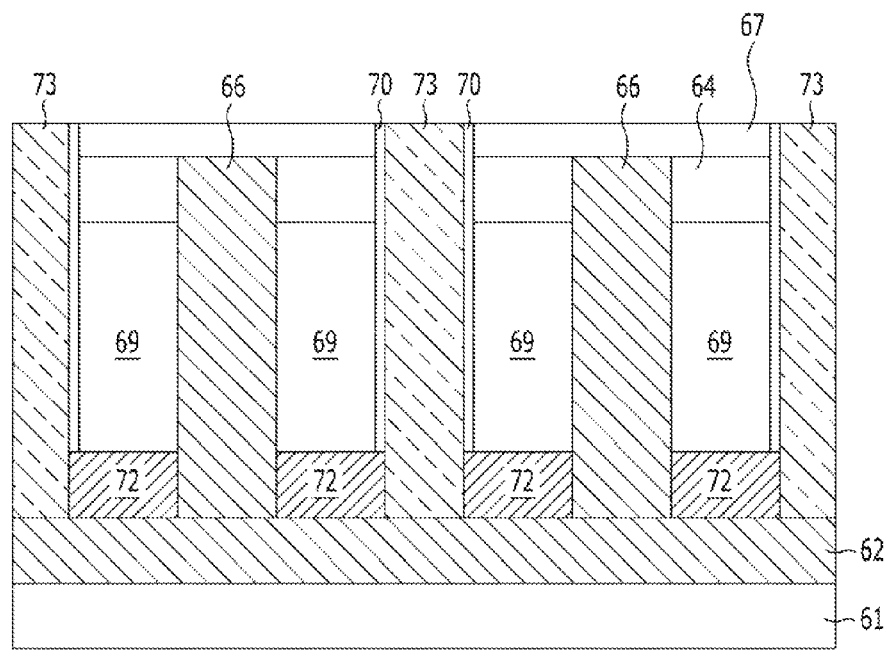

As illustrated in FIG. 6G, the unreacted metal layer may be removed using a wet etching process.

Meanwhile, if the metal layer 71 includes cobalt, then the rapid thermal annealing (RTA) process is performed at least twice in order to form a cobalt silicide. For example, a primary annealing process and a secondary annealing process are performed. The primary annealing process is performed at a temperature of about 400° C. to about 600° C. and the secondary annealing process is performed at a temperature of about 600° C. to about 800° C. As a result of the primary annealing process, a cobalt silicide having a $CoSi_x$ (x=0.1 to 1.5) phase is formed. As a result of the secondary annealing process, the cobalt silicide having the $CoSi_x$ phase is converted to a cobalt silicide having a CoSi$_2$ phase. Among cobalt silicides, the cobalt silicide having the CoSi$_2$ phase has the lowest resistivity. Between the primary annealing process and the secondary annealing process, unreacted cobalt is removed. The unreacted cobalt may be removed using a mixed chemical of sulfuric acid (H$_2$SO$_4$) and hydrogen peroxide (H$_2$O$_2$).

A first interlayer dielectric layer 73 is formed over a resultant structure to fill the second trench 68. The first interlayer dielectric layer 73 may include an oxide, such as BPSG. The first interlayer dielectric layer 73 may be subject to a planarization process such that the surface of the second mask pattern 67 is exposed. Adjacent buried bit lines 72 are isolated from each other by the first interlayer dielectric layer 73.

Subsequently, a vertical channel transistor including a pillar and a capacitor may be further formed. This refers to FIG. 4A to FIG. 4D.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   etching a semiconductor substrate to form bulb-type trenches that define a plurality of active regions in the semiconductor substrate;
   forming a supporter in each of the bulb-type trenches;
   dividing each active region, of the plurality of active regions, into a pair of body lines by forming a trench through each active region; and
   forming a bit line in each body line of the pair of body lines,
   wherein the dividing of each active region into a pair of body lines comprises:
   partially etching a thickness of each active region to form the trenches;
   forming spacers on sidewalls of the trenches;
   etching surfaces of the plurality of active regions that define bottom surfaces of the trenches to increase a depth of the trenches; and
   etching sidewalls, which define the trenches, of the pair of body lines to form recessed lower sidewalls extending in a direction perpendicular to a longitudinal direction of the trenches.

2. The method of claim 1, further comprising:
   forming a conductive layer in the trenches so that the recessed lower sidewalls are buried by the conductive layer; and
   removing the conductive layer from the trenches, except for the recessed lower sidewalls to form buried bit lines in the recessed lower sidewalls of the body lines.

3. A method for fabricating a semiconductor device, the method comprising:
   forming an insulation layer on a semiconductor substrate;
   forming a conductive layer on the insulation layer;
   etching the conductive layer to form first trenches that define a plurality of active regions;
   forming a supporter in each of the trenches;
   dividing each active region, of the plurality of active regions, into a pair of body lines by forming a second trench through each active region; and
   forming a bit line in each body line of the pair of body lines.

4. The method of claim 3, further comprising:
   after forming the bit lines, etching the pair of the body lines to form a pair of pillars, where the pair of pillars each include channel region; and
   forming a capacitor connected to an upper portion of each pillar.

5. The method of claim 3, wherein the supporters comprise an insulation material.

6. The method of claim 3, wherein the dividing of each active region into a pair of body lines comprises:
   partially etching a thickness of each active region to form the second trenches;
   forming spacers on sidewalls of the second trenches; and
   etching surfaces of the plurality of active regions that define bottom surfaces of the second trenches to form recessed lower sidewalls extending in a direction perpendicular to a longitudinal direction of the second trenches.

7. The method of claim 6, further comprising:
   forming a metal layer in the trenches so that the recessed lower sidewalls are buried by the metal layer; and
   removing the metal layer from the trenches, except for the recessed lower sidewalls, to form buried bit lines in the recessed lower sidewalls of the body lines.

\* \* \* \* \*